United States Patent
Kubota et al.

(10) Patent No.: US 11,515,468 B2
(45) Date of Patent: Nov. 29, 2022

(54) PIEZOELECTRIC CERAMICS, MANUFACTURING METHOD FOR PIEZOELECTRIC CERAMICS, PIEZOELECTRIC ELEMENT, VIBRATION DEVICE, AND ELECTRONIC DEVICE

(71) Applicant: CANON KABUSHIKI KAISHA, Tokyo (JP)

(72) Inventors: Makoto Kubota, Yokohama (JP); Yasushi Shimizu, Fujisawa (JP); Takanori Matsuda, Chofu (JP); Tatsuo Furuta, Machida (JP); Kaoru Miura, Matsudo (JP); Miki Ueda, Tokyo (JP); Kanako Oshima, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 974 days.

(21) Appl. No.: 16/263,290

(22) Filed: Jan. 31, 2019

(65) Prior Publication Data
US 2019/0245135 A1 Aug. 8, 2019

(30) Foreign Application Priority Data
Feb. 7, 2018 (JP) .............................. JP2018-020321

(51) Int. Cl.
*H01L 41/18* (2006.01)
*H01L 41/187* (2006.01)
(Continued)

(52) U.S. Cl.
CPC ...... *H01L 41/1871* (2013.01); *C04B 35/4682* (2013.01); *C04B 35/62685* (2013.01);
(Continued)

(58) Field of Classification Search
None
See application file for complete search history.

(56) References Cited

U.S. PATENT DOCUMENTS 6,523,943 B1 * 2/2003 Fukui .................. H01L 41/0973
347/68
8,182,713 B2 5/2012 Ren et al.
(Continued)

FOREIGN PATENT DOCUMENTS

JP 2003-128460 A 5/2003
JP 2009-215111 A 9/2009

OTHER PUBLICATIONS

Saburo Nagakura et al. (ed.), Iwanami Physicochemical Dictionary, 5th Edition, pp. 1268-1269 (Iwanami Shoten, Publishers; Feb. 20, 1998).

*Primary Examiner* — Erica S Lin
(74) *Attorney, Agent, or Firm* — Venable LLP

(57) ABSTRACT

Provided is a piezoelectric ceramics having a gradual change in piezoelectric constant depending on an ambient temperature. Specifically, provided is a single-piece piezoelectric ceramics including as a main component a perovskite-type metal oxide represented by a compositional formula of $ABO_3$, wherein an A site element in the compositional formula contains Ba and $M_1$, the $M_1$ being formed of at least one kind selected from the group consisting of Ca and Bi, wherein a B site element in the compositional formula contains Tl and $M_2$, the $M_2$ being formed of at least one kind selected from the group consisting of Zr, Sn, and Hf, wherein concentrations of the $M_1$ and the $M_2$ change in at least one direction of the piezoelectric ceramics, and wherein increase and decrease directions of concentration changes of the $M_1$ and the $M_2$ are directions opposite to each other.

10 Claims, 13 Drawing Sheets

THICKNESS DIRECTION OF THE PLATE-LIKE PIEZOELECTRIC CERAMICS   THICKNESS DIRECTION OF THE PLATE-LIKE PIEZOELECTRIC CERAMICS

(51) Int. Cl.
*H01L 41/083* (2006.01)
*H01L 41/047* (2006.01)
*H01L 41/09* (2006.01)
*C04B 35/468* (2006.01)
*H01L 41/43* (2013.01)
*C04B 35/626* (2006.01)

(52) U.S. Cl.
CPC ...... *H01L 41/0471* (2013.01); *H01L 41/0472* (2013.01); *H01L 41/083* (2013.01); *H01L 41/09* (2013.01); *H01L 41/43* (2013.01); *C04B 2235/3208* (2013.01); *C04B 2235/3215* (2013.01); *C04B 2235/3236* (2013.01); *C04B 2235/3248* (2013.01); *C04B 2235/3249* (2013.01); *C04B 2235/3262* (2013.01); *C04B 2235/3298* (2013.01); *C04B 2235/5445* (2013.01); *C04B 2235/72* (2013.01); *C04B 2235/75* (2013.01); *C04B 2235/768* (2013.01); *C04B 2235/79* (2013.01)

(56) References Cited

U.S. PATENT DOCUMENTS

| | | | |
|---|---|---|---|
| 9,252,685 B2 | 2/2016 | Ifuku et al. | |
| 9,614,141 B2 | 4/2017 | Shimizu et al. | |
| 9,917,245 B2 | 3/2018 | Kubota et al. | |
| 2015/0171311 A1* | 6/2015 | Kubota | H02N 2/163 347/68 |
| 2018/0233655 A1 | 8/2018 | Saito et al. | |

\* cited by examiner

INCREASE AND DECREASE DIRECTIONS
OF CONCENTRATION CHANGES

PIEZOELECTRIC CERAMICS, MANUFACTURING METHOD FOR PIEZOELECTRIC CERAMICS, PIEZOELECTRIC ELEMENT, VIBRATION DEVICE, AND ELECTRONIC DEVICE

BACKGROUND OF THE INVENTION

Field of the Invention

The present invention relates to a piezoelectric ceramics, and more particularly, to a lead-free piezoelectric ceramics and a manufacturing method therefor. The present invention also relates to a piezoelectric element, a vibration device, and an electronic device each using the piezoelectric ceramics.

Description of the Related Art

A perovskite-type metal oxide of an $ABO_3$ type, such as lead zirconate titanate (hereinafter referred to as "PZT"), which contains lead, is a typical piezoelectric material. A piezoelectric element obtained by forming electrodes on a surface of a piezoelectric material is used in a variety of piezoelectric devices and electronic devices, such as an actuator, an oscillator, a sensor, and a filter, by utilizing its piezoelectric effect.

However, PZT contains lead as an A site element, and hence its influence on an environment is regarded as a problem. For example, a lead component in a discarded piezoelectric material may elute into soil to adversely affect an ecosystem. Accordingly, there is a proposal of a piezoelectric ceramics using a lead-free perovskite-type oxide.

Barium titanate is known as a piezoelectric ceramics formed of the lead-free perovskite-type metal oxide. In Japanese Patent Application Laid-Open No. 2009-215111, there is a disclosure of a piezoelectric ceramics based on a pseudo-binary solid solution of barium zirconate titanate $(Ba(Zr_{0.2}Ti_{0.8})O_3)$ and barium calcium titanate $((Ba_{0.7}Ca_{0.3})TiO_3)$, for improving a piezoelectric property of barium titanate at about room temperature. A piezoelectric ceramics of Examples shown in Table 2 of Japanese Patent Application Laid-Open No. 2009-215111 has an extremely high piezoelectric property with a piezoelectric constant $d_{33}$ of more than 580 pC/N at room temperature. However, as shown in FIG. 5 of Japanese Patent Application Laid-Open No. 2009-215111, the piezoelectric constant significantly fluctuates depending on an ambient temperature. For example, a lowering in piezoelectric constant of about 20% per 10° C. was found in the vicinity of a peak of the property. When the piezoelectric constant significantly fluctuates depending on the ambient temperature in a practical temperature region as described above, a piezoelectric element including the piezoelectric ceramics does not have a stable displacement amount, and hence driving thereof is difficult to precisely control.

In order to suppress the fluctuation in piezoelectric constant depending on the ambient temperature in the practical temperature region, for example, in Japanese Patent Application Laid-Open No. 2003-128460, there is a disclosure of a technology for reducing a change in distortion amount with respect to a temperature change at around room temperature, without lowering a Curie temperature, by substituting part of Ba of barium titanate ($BaTiO_3$) with Ca. However, as shown in Table 1 and FIG. 5 of Japanese Patent Application Laid-Open No. 2003-128460, there has been a problem in that, when temperature dependence at around room temperature is lowered, the piezoelectric constant itself takes a small value. In Japanese Patent Application Laid-Open No. 2003-128460, there is also a disclosure of a technology for increasing the piezoelectric constant by increasing an average grain diameter of crystal grains forming the piezoelectric ceramics to, for example, 60.9 μm. In this case, however, there has been a problem in that fine processability and mechanical strength of the ceramics are lowered.

SUMMARY OF THE INVENTION

The present invention has been made in order to solve such problems as described above, and provides a lead-free piezoelectric ceramics that stably exhibits an excellent piezoelectric constant in a practical temperature region, for example, the range of from 0° C. or more to 40° C. or less. The present invention also provides a manufacturing method for the piezoelectric ceramics, and a piezoelectric element, a vibration device, and an electronic device each using the piezoelectric ceramics.

In order to solve the above-mentioned problems, according to one embodiment of the present invention, there is provided a single-piece piezoelectric ceramics including as a main component a perovskite-type metal oxide represented by a compositional formula of $ABO_3$, wherein the A site element contains Ba and $M_1$, the $M_1$ being formed of at least one kind selected from the group consisting of Ca and Bi, wherein the B site element contains Ti and $M_2$, the $M_2$ being formed of at least one kind selected from the group consisting of Zr, Sn, and Hf, wherein concentrations of the $M_1$ and the $M_2$ change in at least one direction of the piezoelectric ceramics, and wherein increase and decrease directions of concentration changes of the $M_1$ and the $M_2$ are directions opposite to each other.

According to one embodiment of the present invention, there is provided a manufacturing method for a piezoelectric ceramics including: stacking a first ceramics precursor and a second ceramics precursor with each other to obtain a multilayered body; and sintering the multilayered body to obtain a single-piece piezoelectric ceramics, wherein the following conditions are satisfied:

$$5° C. \le |T_{otA} - T_{otB}| \le 30° C.$$

$$0 \le 2|d_{31A} - d_{31B}|/|d_{31A} + d_{31B}| \le 0.2$$

where $T_{otA}$ and $T_{otB}$ represent respective orthorhombic-to-tetragonal phase transition temperatures of a first ceramics obtained by sintering the first ceramics precursor alone and a second ceramics obtained by sintering the second ceramics precursor alone, and $d_{31A}$ and $d_{31B}$ represent respective piezoelectric constants thereof after polarization treatment.

According to one embodiment of the present invention, there is provided a piezoelectric element including: a first electrode; a piezoelectric ceramics portion; and a second electrode, wherein a piezoelectric ceramics for forming the piezoelectric ceramics portion includes the piezoelectric ceramics according to the embodiment of the present invention.

According to one embodiment of the present invention, there is provided a vibration device including a vibration body including a diaphragm including the piezoelectric element according to the embodiment of the present invention.

According to one embodiment of the present invention, there is provided an electronic device including the piezoelectric element according to the embodiment of the present invention.

According to the present invention, the piezoelectric ceramics having a gradual change in piezoelectric constant in the practical temperature region, for example, the range of from 0° C. or more to 40° C. or less can be provided by integrating a plurality of piezoelectric materials different from each other in phase transition temperature, which is a temperature at which the piezoelectric constant becomes maximum with respect to temperature, with each other as ceramics without forming a solid solution. The present invention can also provide the manufacturing method for the piezoelectric ceramics, and the piezoelectric element, the vibration device, and the electronic device each using the piezoelectric ceramics.

In addition, the piezoelectric ceramics of the present invention uses substantially no lead, and hence has an extremely small load on the environment.

Further features of the present invention will become apparent from the following description of exemplary embodiments with reference to the attached drawings.

DESCRIPTION OF THE EMBODIMENTS

Figure 1:
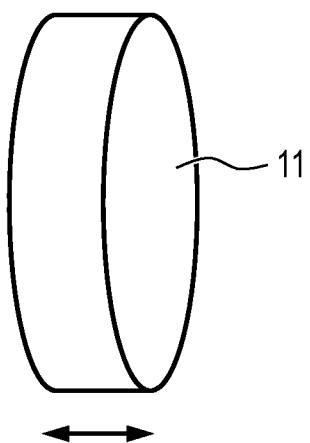
FIG. 1 is a schematic view for illustrating the configuration of a piezoelectric ceramics according to one embodiment of the present invention.

Embodiments of the present invention are described below.

The present invention relates to a single-piece lead-free piezoelectric ceramics in which the Ba site and T1 site of barium titanate ($BaTiO_3$) having a perovskite-type structure are partially substituted with other metal elements. A change in piezoelectric constant in a practical temperature region is reduced by changing local concentrations of the substituting elements depending on sites in the single-piece piezoelectric ceramics.

The average concentration of a substituting element in a barium titanate-based piezoelectric ceramics is associated with the phase transition temperature of the crystal structure of the piezoelectric ceramics. The barium titanate-based piezoelectric ceramics has such a property that its piezoelectric constant increases at a phase transition temperature between an orthorhombic structure and a tetragonal structure. Therefore, the phase transition temperature is preferably controlled to be in the practical temperature region of the piezoelectric ceramics, or in the vicinity of the practical temperature region.

It is known that the crystal structure of the barium titanate-based piezoelectric ceramics transitions from a rhombohedral structure to an orthorhombic structure, to a tetragonal structure, and to a cubic structure with a change in ambient temperature from a lower temperature side. A temperature at which the transition between the structures occurs is referred to as phase transition temperature. In the case of a piezoelectric ceramics, the piezoelectric constant takes a maximum value at around the phase transition temperature. Therefore, in the present invention, the temperature corresponding to the maximum value of the piezoelectric constant with respect to temperature is adopted as the phase transition temperature. The structures before and after the transition may be identified by X-ray diffraction measurement or electron beam diffraction measurement.

Meanwhile, the concentration change of a substituting element provides an effect of alleviating an abrupt change in piezoelectric constant at temperatures in the vicinity of the phase transition temperature.

The practical temperature region of the piezoelectric ceramics varies depending on its applications, but is generally from 0° C. or more to 40° C. or less. For example, when a temperature at which the piezoelectric constant becomes largest in the range of from 0° C. or more to 40° C. or less is represented by Tmax, and the absolute value of a piezoelectric constant $d_{31}$ at Tmax is represented by dmax, if the extent of fluctuation in piezoelectric constant in the range of Tmax±10° C. falls within −15%, more preferably −10%, of dmax, the design of a device using such piezoelectric ceramics becomes easy. In addition, a case in which dmax is 140 pm/V or more is preferred because conversion efficiency between electrical energy and mechanical energy increases and the design of a device using such piezoelectric ceramics becomes easy.

When the phase transition temperature of the piezoelectric ceramics falls within the practical temperature region, the phase transition temperature coincides with Tmax.

The piezoelectric ceramics of the present invention also has reduced changes in relative dielectric constant and ferroelectricity with respect to temperature, and hence can be utilized as a dielectric material for various applications, such as a capacitor, a memory, and a sensor.

The piezoelectric ceramics of the present invention has the following features.
(1) A single-piece piezoelectric ceramics.
(2) The piezoelectric ceramics includes as a main component a perovskite-type metal oxide represented by a compositional formula of $ABO_3$.
(3) The A site element contains Ba and $M_1$, and the $M_1$ is formed of at least one kind selected from the group consisting of Ca and Bi.
(4) The B site element contains T1 and $M_2$, and the $M_2$ is formed of at least one kind selected from the group consisting of Zr, Sn, and Hf.
(5) Concentrations of the $M_1$ and the $M_2$ change in at least one direction of the piezoelectric ceramics, and increase and decrease directions of concentration changes of the $M_1$ and the $M_2$ are directions opposite to each other.

(Feature 1)

The piezoelectric ceramics of the present invention is formed of a single-piece piezoelectric ceramics. The term "single-piece piezoelectric ceramics" as used herein means a structurally seamless ceramics having piezoelectricity obtained by firing one compact.

The present invention has a feature in that composition and temperature properties are changed depending on sites in the single-piece piezoelectric ceramics. In contrast, a configuration that is not a single piece, obtained by bonding together a plurality of piezoelectric ceramics having different properties, is unsuitable for a piezoelectric actuator because modes of vibration generated from the piezoelectric ceramics are not unified.

It is preferred that at least part of the single-piece piezoelectric ceramics be subjected to polarization treatment to have the directions of spontaneous polarization axes aligned. When the polarization treatment is performed with an external electric field, the vibration generated from the piezoelectric ceramics of the present invention further increases.

The shape of the single-piece piezoelectric ceramics is not limited. With a view to forming a plurality of electrodes thereon to provide a piezoelectric element, the shape is preferably a plate shape having two or more flat surfaces, more preferably a flat plate shape, a rectangular plate shape, a disc shape, or a doughnut shape.

(Feature 2)

The piezoelectric ceramics of the present invention contains as a main component a perovskite-type metal oxide represented by the compositional formula of $ABO_3$. It is more preferred that the crystal structure of the metal oxide forming the piezoelectric ceramics of the present invention be a so-called single phase formed only of a perovskite-type structure. For example, when the crystal structure of the metal oxide forming the piezoelectric ceramics has mixed therein a hexagonal structure, there is a risk in that the piezoelectric constant of the piezoelectric ceramics may be significantly lowered.

In the present invention, the perovskite-type metal oxide refers to a metal oxide having a perovskite-type structure (sometimes referred to as "perovskite structure") that is ideally a cubic structure as described in Iwanami Rikagaku Jiten 5th Edition (published by Iwanami Shoten on Feb. 20, 1998). The metal oxide having a perovskite-type structure is generally represented by the compositional formula of $ABO_3$. In the perovskite-type metal oxide, elements A and B occupy specific positions in a unit cell, which are called an A site and a B site, respectively, in the form of ions. For example, in the case of a cubic unit cell, the A site element occupies the corners of a cubic, and the B site element occupies a body-centered position of the cubic. An O element occupies the face-centered positions of the cubic as an anion of oxygen. The A site element is 12-coordinate, and the B site element is 6-coordinate. When the coordinates of each of the A site element, the B site element, and the O element slightly shift from a symmetrical position in a unit cell, the unit cell of the perovskite-type structure is distorted to become a crystal system such as a tetragonal, rhombohedral, or orthorhombic crystal system.

It is intended that, in the material of the present invention, ideally, Ba and $M_1$ are positioned at the A site, and T1 and $M_2$ are positioned at the B site. However, even when part of Ba and $M_1$ are positioned at the B site, or part of T1 and $M_2$ are positioned at the A site, the effect of the present invention is obtained.

In addition, the compositional formula of a perovskite-type metal oxide is generally expressed by $ABO_3$. In actuality, however, owing to volatilization at the time of firing and an error in composition analysis, a quantitative ratio among the A site element, the B site element, and the oxygen element in the metal oxide as a whole is not necessarily 1:1:3. Such case also falls within the scope of the present invention as long as the oxide has a perovskite-type structure as a primary phase.

That the oxide has a perovskite-type structure may be judged from, for example, the measurement results of X-ray diffraction or electron beam diffraction on the piezoelectric ceramics. In the present invention, the concentrations of $M_1$ and $M_2$ undergo changes of increasing and decreasing in a certain direction, for example, a thickness direction. Therefore, it is preferred that the crystal structure be confirmed by performing diffraction measurement from a plurality of directions of the piezoelectric ceramics, or performing diffraction measurement for the piezoelectric ceramics that has been powdered.

A state in which the piezoelectric ceramics of the present invention contains as a main component the perovskite-type metal oxide represented by the compositional formula of $ABO_3$ means that Ba, Ca, Bi, Ti, Zr, Sn, Hf, and O are detected as major components when the composition of the piezoelectric ceramics of the present invention is analyzed. For example, a case in which the sum total of Ba, Ca, Bi, Ti, Zr, Sn, Hf, and O is 97.5 mol % or more with respect to all elements detected in the composition analysis is preferred because the temperature stability of the piezoelectric constant, which is the effect of the present invention, is sufficiently obtained.

The piezoelectric ceramics of the present invention may contain auxiliary components for the purpose of adjusting properties. A case in which the content of the auxiliary components is less than 2.5 mol % in terms of sum total of elements with respect to all elements detected in the composition analysis is preferred because the temperature stability of the piezoelectric constant, which is the effect of the present invention, is hardly influenced.

Mn is given as an auxiliary component suitable for adjusting the properties of the piezoelectric ceramics of the present invention. When the piezoelectric ceramics of the present invention contains an appropriate amount of Mn, a high electrical insulation property is obtained. A piezoelectric ceramics having a high electrical insulation property reduces electric power to be consumed in the driving of an element including the piezoelectric ceramics. Mn has a property of varying in valence from divalent to tetravalent, and plays a role in compensating for a deficiency in charge balance in the piezoelectric ceramics.

When the amount of the Mn component contained in the piezoelectric ceramics is 0.3 part by mol or more and 1.5 parts by mol or less on a metal basis with respect to 100 parts by mol of the metal oxide ($ABO_3$), a particularly high electrical insulation property is obtained.

Part or all of Mn serving as an auxiliary component may be positioned at any site in the unit cell of the perovskite-type metal oxide serving as the main component.

Elemental composition analysis of the main component and the auxiliary components contained in the piezoelectric ceramics of the present invention may be performed by ICP emission spectrometry, X-ray fluorescence analysis, atomic absorption spectrometry, mass spectrometry, or the like.

It is preferred that the piezoelectric ceramics of the present invention contain less than 1,000 ppm of a Pb component and a K component in total.

It is more preferred that the piezoelectric ceramics contain less than 500 ppm of the Pb component and less than 500 ppm of the K component. It is still more preferred that the piezoelectric ceramics contain less than 500 ppm of the Pb component and the K component in total.

When the amount of the Pb component contained in the piezoelectric ceramics of the present invention is reduced, the influence of the Pb component to be released into the environment when the piezoelectric ceramics is left in water or in soil can be reduced.

When the amount of the K component contained in the piezoelectric ceramics of the present invention is reduced, the moisture resistance of the piezoelectric ceramics and the efficiency in its high-speed vibration are enhanced.

(Feature 3)

The A site element in the metal oxide ($ABO_3$) contains Ba and $M_1$, and $M_1$ is formed of at least one kind selected from the group consisting of Ca and Bi.

When Ba is mainly positioned at the A site of the perovskite-type structure, a barium titanate-type framework is stabilized, and hence a large piezoelectric constant is obtained in the practical temperature region including room temperature.

Besides, when the A site has mixed therein $M_1$, namely, Ca or Bi, a temperature $T_{ot}$, at which the kind of the perovskite-type structure of the metal oxide undergoes phase transition from an orthorhombic system to a tetragonal system can be shifted toward lower temperatures. A temperature $T_{to}$, at which transition from a tetragonal system to an orthorhombic system occurs, also shifts toward lower temperatures. As described later, the $M_2$ element has an effect of shifting $T_{ot}$ and $T_{to}$ to higher temperatures. By virtue of the combination of the $M_1$ element and the $M_2$ element, the phase transition temperature, namely, the temperature at which the piezoelectric constant becomes maximum can be adjusted to a desired temperature without sacrificing the piezoelectric constant.

The present invention has a feature in that the change in piezoelectric constant in the practical temperature region is reduced as a result of the concentration changes of components in the piezoelectric ceramics. The fluctuation in piezoelectric constant with respect to temperature resulting from the phase transition temperature can be alleviated by setting the concentration of $M_1$ at a certain site in the ceramics to a relatively high level and setting the concentration of $M_1$ at another site to a relatively low level.

In the A site element of the compositional formula, a case in which a ratio "x" of the molar amount of Ca to the total molar amount of Ba, Ca, and Bi falls within the range of 0.05≤x≤0.12 is preferred because the piezoelectric constant in the practical temperature region including room temperature becomes comparatively large. Similarly, a case in which a ratio "y" of the molar amount of Bi to the total molar amount of Ba, Ca, and Bi falls within the range of 0.001≤y≤0.005 is preferred because $T_{ot}$ can be lowered while the lowering of a Curie temperature is suppressed.

(Feature 4)

The B site element contains T1 and $M_2$, and the $M_2$ is formed of at least one kind selected from the group consisting of Zr, Sn, and Hf.

When Ti, which has a small ionic radius and has vacant d orbitals for electrons, is mainly positioned at the B site of the perovskite-type structure, the electrons of T1 and the electrons of O (oxygen) repulse each other and a large piezoelectric constant is obtained in the vicinity of room temperature.

Besides, when the B site has mixed therein $M_2$, namely, Zr, Sn, or Hf, the anisotropy (c/a) of the tetragonal structure of the barium titanate-type framework reduces, and the stability of the tetragonal structure is lowered. As a result, the phase transition temperature $T_{ot}$ shifts to a higher temperature.

The coexistence of the $M_1$ element and the $M_2$ element provides the following advantage: even when local phase transition temperatures in the ceramics are distributed, local piezoelectric constants are kept uniform, and hence noise is not generated in a vibration wave generated from the piezoelectric ceramics.

In the B site element of the compositional formula, a case in which a ratio "l" of the molar amount of Zr to the total molar amount of Ti, Zr, Sn, and Hf, a ratio "m" of the molar amount of Sn to the total molar amount, and a ratio "n" of the molar amount of Hf to the total molar amount satisfy 0≤l≤0.08, 0≤m≤0.03, and 0≤n≤0.08, respectively, and in which "l", "m", and "n" have a relationship of 0.04≤l+2.5m+n≤0.08 is preferred because the piezoelectric constant in the practical temperature region increases.

The compositional formula $ABO_3$ may be expressed as $(Ba_{1-x-y}Ca_xBi_y)a(Ti_{1-l-m-n}Zr_lSn_mHf_n)O_3$. The parameter "a" in the formula represents a ratio between the A site element number and the B site element number in the perovskite-type metal oxide. In order for the piezoelectric ceramics of the present invention to achieve a sufficient piezoelectric constant and to exhibit a high electrical insulation property, the range of "α" is preferably from 0.98 or more to 1.02 or less. An ideal value of "α" is 1.00, but in the case where a component for the Mn element is contained as an auxiliary component, part thereof can be positioned at the B site, and hence a particularly excellent piezoelectric property is exhibited when "a" represents 1.005 or more and 1.010 or less.

(Feature 5)

Concentrations of the $M_1$ and the $M_2$ change in at least one direction of the piezoelectric ceramics, and increase and decrease directions of concentration changes of the $M_1$ and the $M_2$ are directions opposite to each other.

FIG. 1 is a view for schematically illustrating the shape of a single-piece piezoelectric ceramics 11 of the present invention having a disc shape.

In general, when a single raw material powder for a ceramics is sintered at a temperature equal to or higher than its crystallization temperature, a sintered body having no variation in concentration is obtained. For example, when a perovskite-type metal oxide expressed by the compositional formula of $(Ba,M_1)(Ti,M_2)O_3$ to be used in the present invention is sintered by a general technique, the local variation in concentration of each of the $M_1$ element and the $M_2$ element at any site in the sintered body is within 1%.

In the piezoelectric ceramics of the present invention, the concentrations of both the $M_1$ element and the $M_2$ element change in at least one direction of the piezoelectric ceramics, and the concentration changes of the $M_1$ element and the $M_2$ element increase and decrease in directions opposite to each other.

In FIG. 1, for convenience of description, a mode in which the concentrations change in the thickness direction of a disc is illustrated. However, in the present invention, the shape of the piezoelectric ceramics is not limited, and may be a rectangular plate shape or a doughnut plate shape. In addition, the change direction of the concentrations is not limited to the thickness direction of a plate, and the concentrations may change in an in-plane direction. However, from the viewpoint of the easiness of manufacture, a configuration in which the concentrations change in the thickness direction of a plate is preferred.

Figure 2A:
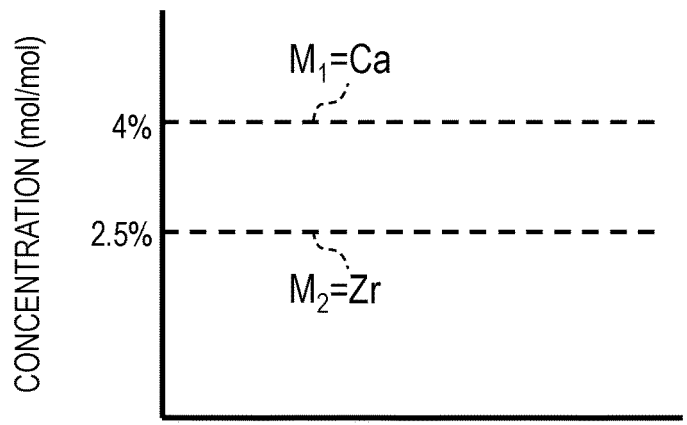
FIG. 2A, FIG. 2B, and FIG. 2C are each a graph for showing relationships between the thickness direction of a plate of a reference piezoelectric ceramics and element concentrations.
Figure 2B:
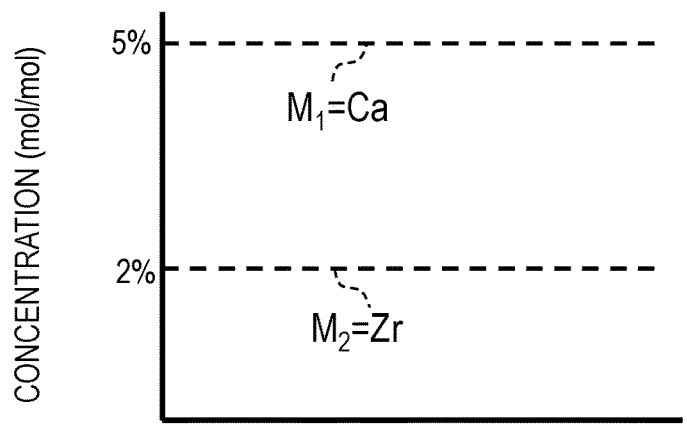
Figure 2C:
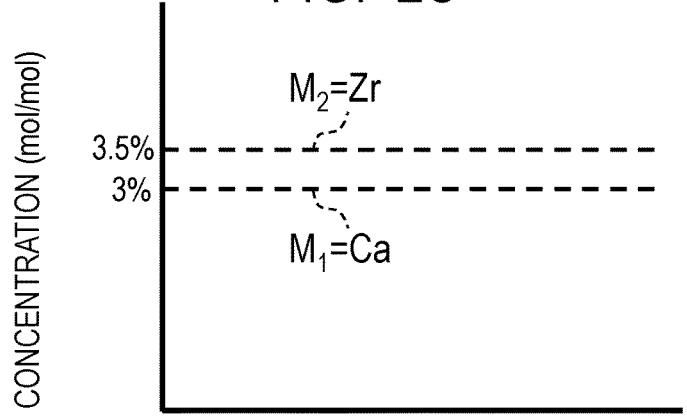

FIG. 2A, FIG. 2B, and FIG. 2C are each a graph for showing the concentration changes of the $M_1$ element and the $M_2$ element in the thickness direction of a plate of a (Ba,Mi)(Ti,$M_2$)$O_3$ ceramics sintered by the general technique. FIG. 2A is a graph for showing the concentration distributions of the $M_1$ element and the $M_2$ element in the thickness direction of a disc-type single-piece piezoelectric ceramics containing as a main component a perovskite-type metal oxide represented by the compositional formula of $(Ba_{0.92}Ca_{0.08})(Ti_{0.95}Zr_{0.05})O_3$. As shown in FIG. 2A, there are no concentration changes of the Ca element and the Zr element in the thickness direction. The axis of ordinate of all the graphs of FIG. 2A, FIG. 2B, and FIG. 2C is plotted as a ratio of an element in question to the sum of the amount of substance of Ba, Ca, Ti, and Zr serving as main components, and hence the Ca concentration and the Zr concentration are respectively shown as 4 mol % and 2.5 mol %, which are half the values in the compositional formula. The changes in element concentrations in the thickness direction of the piezoelectric ceramics may be measured by, for example, repeating X-ray fluorescence analysis while polishing the plate planes of the disc-like ceramics. When the value of the concentration has a fluctuation of within ±0.5% with respect to the absolute value, or within ±10% with respect to the initial value, the fluctuation falls within the range of errors in measurement, and hence the concentration may be said to be uniform.

Through the formation of electrodes on two opposed plate planes of the piezoelectric ceramics of the composition as shown in FIG. 2A, a piezoelectric element is obtained. Through the processing of the piezoelectric element into a plate shape having an aspect ratio of, for example, 12 mm×3 mm×1 mmt, an element for evaluating stretching vibration (31 mode) in a long side direction is obtained. The state of the change in piezoelectric constant of the piezoelectric element with respect to temperature can be found out by subjecting the piezoelectric element to appropriate polarization treatment and evaluating the piezoelectric constant $d_{31}$ of the resultant by a resonance-antiresonance method in a temperature range including the practical temperature region, for example, ambient temperatures of from −30° C. to 45° C.

The piezoelectric constant is an amount that indicates the degree of the displacement (elongation, contraction, or shear) of the piezoelectric ceramics at a time when a voltage is applied to the piezoelectric ceramics. The piezoelectric constant $d_{31}$ is the coefficient of proportionality of a voltage with respect to a contraction (elongation) displacement in a direction orthogonal to the polarization direction of the piezoelectric ceramics when the voltage is applied in the polarization direction (generally a direction in which a voltage is applied during the polarization treatment), namely a displacement amount per unit voltage. Conversely, the piezoelectric constant may also be defined as the amount of charge to be induced when a stress is applied to the material. The piezoelectric constant $d_{31}$ is generally expressed as a negative value, but herein, its absolute value $|d_{31}|$ is evaluated. A larger value for $|d_{31}|$ is preferred in applications of piezoelectric devices.

The piezoelectric constant of the piezoelectric ceramics may be determined by calculation, from the measurement results of a resonance frequency and an antiresonance frequency, which are obtained with a commercially available impedance analyzer, based on the standard of Japan Electronics and Information Technology Industries Association (JEITA EM-4501). This measurement method is referred to as resonance-antiresonance method.

Herein, a case in which the resonance-antiresonance method is used as a method of measuring the piezoelectric constant is described. However, alternatively, the piezoelectric constant may be calculated through the measurement of a displacement amount at the time of voltage application, or through the measurement of the amount of charge induced at the time of stress application, or a test may be performed using, in place of the piezoelectric constant, a change in another kind of piezoelectric constant, such as a d33 constant, with respect to temperature.

Figure 3A:
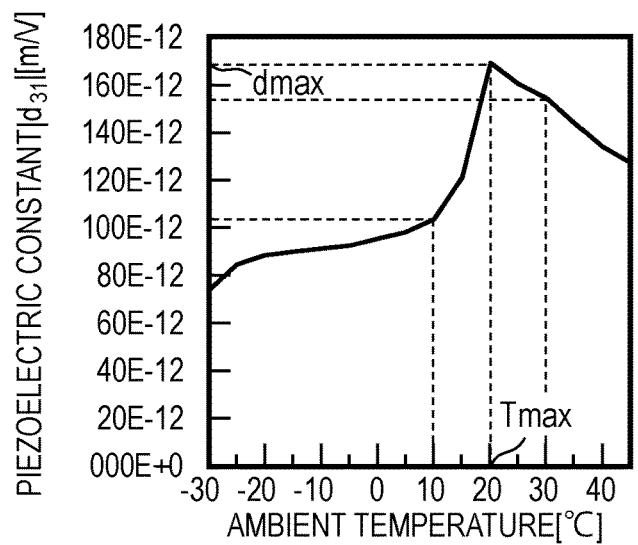
FIG. 3A, FIG. 3B, and FIG. 3C are each a graph for showing a relationship between the piezoelectric constant of a reference piezoelectric element and an ambient temperature.
Figure 3B:
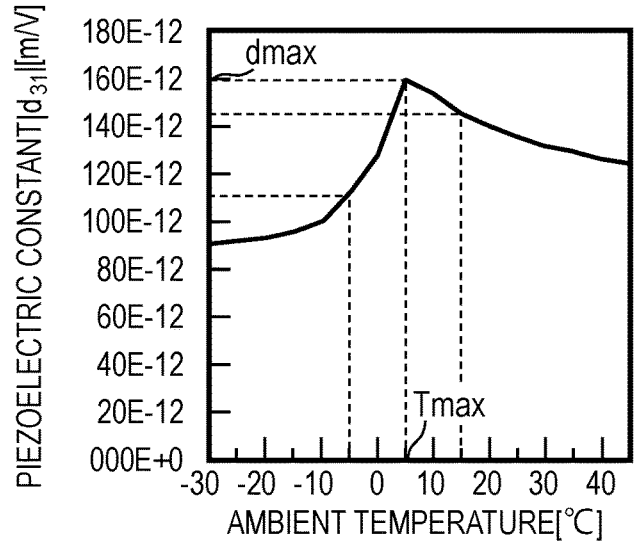
Figure 3C:
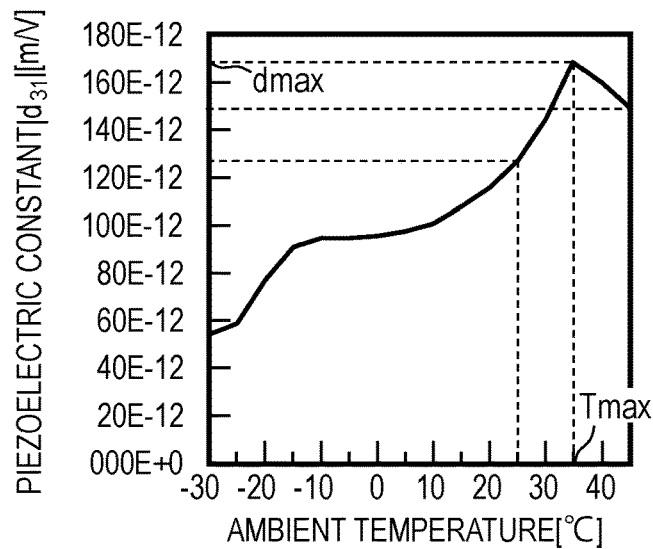

FIG. 3A, FIG. 3B, and FIG. 3C are graphs for showing the properties of piezoelectric elements using the piezoelectric ceramics shown as examples in FIG. 2A, FIG. 2B, and FIG. 2C, respectively.

FIG. 3A is a graph for showing a relationship between: the piezoelectric constant $|d_{31}|$ of a piezoelectric element using the piezoelectric ceramics shown in FIG. 2A, which contains as a main component the perovskite-type metal oxide represented by the compositional formula of $(Ba_{0.92}Ca_{0.08})(Ti_{0.95}Zr_{0.05})O_3$, and which does not have concentration distributions of the $M_1$ element and the $M_2$ element; and an ambient temperature. For the purposes of enhancing the insulation property with respect to polarization treatment and maximizing the piezoelectric constant, a component for the Mn element has been added at 0.6 part by mol (on a metal basis) with respect to 100 parts by mol of the perovskite-type metal oxide.

As shown in FIG. 3A, the piezoelectric ceramics of this composition manufactured under optimized sintering conditions has various piezoelectric constants depending on temperature at ambient temperatures of from −30° C. to 45° C. The change curve of the piezoelectric constant in FIG. 3A is data measured while increasing the ambient temperature after the piezoelectric ceramics that has been subjected to polarization treatment has been left to stand at an ambient temperature of −30° C. or less. Herein, an effect is described using the change ratio of the piezoelectric constant measured while increasing the ambient temperature. However, the present invention also shows a similar effect on the change ratio of the piezoelectric constant measured while decreasing the temperature.

In FIG. 3A, the absolute value (dmax) of the largest piezoelectric constant in the range of from 0° C. or more to 40° C. or less is 168 pm/V, and the corresponding temperature Tmax is 20° C., corresponding to the temperature ($T_{ot}$) at which phase transition occurs from an orthorhombic crystal structure to a tetragonal crystal structure. The minimum piezoelectric constant in the range of Tmax±10° C. is 104 pm/V at a time when the temperature is increased to 10° C., and the change ratio therebetween is as large as (104−168)/168=−38.2%. When, as described above, in the practical temperature region, the change of the piezoelectric constant with respect to temperature has a large absolute value exceeding, for example, that of −15% of the peak value, an input electric signal for obtaining stable driving from the piezoelectric device is changed depending on temperature, and hence device design becomes difficult.

The Tmax value of a piezoelectric ceramics may be controlled using a conventional technology. FIG. 2B is a graph for showing the concentration distributions of the $M_1$ element and the $M_2$ element in the thickness direction of a disc-type single-piece piezoelectric ceramics containing as a main component a perovskite-type metal oxide represented by the compositional formula of $(Ba_{0.90}Ca_{0.10})(Ti_{0.96}Zr_{0.04})O_3$. Also in this example, there are no concentration changes of the Ca element and the Zr element in the thickness direction of the piezoelectric ceramics.

FIG. 3B is a graph for showing a relationship between: the piezoelectric constant $|d_{31}|$ of a piezoelectric element using the piezoelectric ceramics shown in FIG. 2B, which contains as a main component the perovskite-type metal oxide represented by the compositional formula of $(Ba_{0.90}Ca_{0.10})(Ti_{0.96}Zr_{0.04})O_3$, and which does not have concentration distributions of the $M_1$ element and the $M_2$ element; and an ambient temperature. For a measurement method and conditions, the same method and conditions as those of FIG. 3A were used. Also in this piezoelectric element, a component for the Mn element has been added at 0.6 part by mol (on a metal basis) with respect to 100 parts by mol of the perovskite-type metal oxide.

In FIG. 3B, dmax is 160 pm/V (dmax), and Tmax is 5° C. As compared to the case of FIG. 3A, the adjustment of the substitution amounts of Ca and T1 has been able to shift Tmax to a lower temperature and suppress the lowering of dmax to within 5%. However, the minimum piezoelectric constant in the range of Tmax±10° C. is 113 pm/V at a time when the temperature is increased to −5° C., and the change ratio therebetween is as large as −29.3%. Thus, the object of exhibiting a stable piezoelectric constant has not been achieved.

Similarly, in FIG. 2C and FIG. 3C, an example of a case in which the composition of the metal oxide serving as the main component is set to $(Ba_{0.94}Ca_{0.06})(Ti_{0.93}Zr_{0.07})O_3$ and 0.6 part by mol of the component for the Mn element is added is shown. Also in this case, Tmax (35° C.) is in the range of the practical temperature region. However, the minimum piezoelectric constant in the range of Tmax±10° C. is 127 pm/V at a time when the temperature is increased to 25° C., and the change ratio with respect to dmax=169 pm/V serving as a reference point is as large as 24.7%. Thus, the object of exhibiting a stable piezoelectric constant has not been achieved.

On the other hand, in the case of the piezoelectric ceramics of the present invention, the concentrations of the $M_1$ element and the $M_2$ element change in at least one direction of the piezoelectric ceramics, which, in the example of FIG. 1, is the thickness direction, and the increase and decrease directions of the concentration changes of the $M_1$ element and the $M_2$ element are directions opposite to each other.

FIG. 4A, FIG. 4B, FIG. 4C, and FIG. 4D are each a graph for showing the concentration changes of the $M_1$ element and the $M_2$ element in the thickness direction of the piezoelectric ceramics in the case where the piezoelectric ceramics of the present invention is manufactured as a single-piece disc-like sintered body. For the sake of simple description, an example in which the $M_1$ element is Ca and the $M_2$ element is Zr is discussed. However, a similar phenomenon occurs even when the $M_1$ element contains Bi, or even when the $M_2$ element contains Sn or Hf.

In each of the examples of FIG. 4A, FIG. 4B, FIG. 4C, and FIG. 4D, unlike the cases of FIG. 2A, FIG. 2B, and FIG. 2C, the concentrations of the Ca element and the Zr element change in the thickness direction of the piezoelectric ceramics.

Figure 4A:
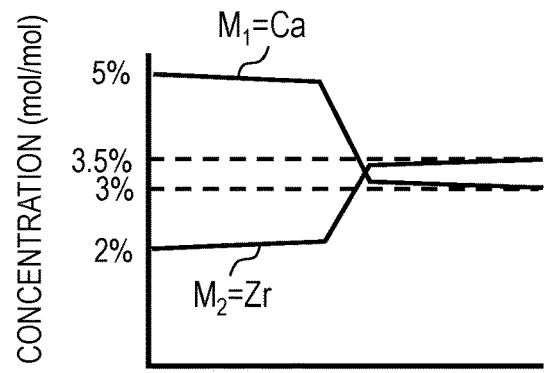
FIG. 4A, FIG. 4B, FIG. 4C, and FIG. 4D are each a graph for showing relationships between the thickness direction of a plate of the piezoelectric ceramics of the present invention and element concentrations.

FIG. 4A is a graph for showing the concentration distributions of the $M_1$ element and the $M_2$ element in the thickness direction of a disc-type single-piece piezoelectric ceramics containing as a main component a perovskite-type metal oxide represented by the compositional formula of $(Ba_{0.92}Ca_{0.08})(Ti_{0.945}Zr_{0.055})O_3$ as the average composition of the disc-like ceramics. The average composition of the piezoelectric ceramics may be determined by, for example, ICP emission spectrometry using a solution obtained by powdering the ceramics and dissolving the powder with an acid.

As shown in FIG. 4A, the concentrations of the Ca element and the Zr element change in the thickness direction. Changes in local concentrations in the thickness direction may be measured by combining a polishing process and X-ray fluorescence analysis as described above. Though not shown in FIG. 4A, there is no in-plane concentration change in this piezoelectric ceramics.

The concentration of the Ca element at the left end of the chart, namely, on one surface of the disc is 5 mol % in terms of ratio of the element in question to the sum of the amounts of substance of Ba, Ca, Ti, and Zr serving as main components, but the Ca concentration gradually decreases as the observation point is moved to the inside of the disc. The minimum concentration in this decrease gradient is about 4.85 mol %, and the concentration change is −3% with reference to the reference point. The concentration of the Ca element abruptly decreases in the vicinity of the center in the thickness direction of the disc. The concentration change in this region is −35%. Beyond that region, as the observation point approaches the right end of the chart, the concentration of the Ca element gradually decreases again at a change ratio of about −3%, and reaches 3 mol % at the right end of the chart, namely, on the opposite surface of the disc. As described above, in the example of FIG. 4A, the concentration of the Ca element monotonically decreases from the left to the right of the chart through three kinds of gradients.

In contrast, the concentration of the Zr element monotonically increases from the left to the right of the chart through three kinds of gradients. That is, the Zr concentration at the left end of the chart is 2 mol %, and the concentration of the Zr element gradually increases as the observation point is moved to the inside of the disc. The concentration change in this increase gradient is +4%. The concentration of the Zr element abruptly increases in the vicinity of the center. The concentration change in this region is +60%. Thereafter, as the observation point approaches the right end of the chart, the concentration of the Zr element gradually increases again at a change ratio of about +4%, and reaches 3.5 mol % at the right end of the chart. That is, the increase and decrease directions of the concentration changes of the $M_1$ element and the $M_2$ element are directions opposite to each other. When $M_1$ contains Bi, or $M_2$ contains Sn or Hf, the increase and decrease tendency of the $M_1$ element or the $M_2$ element may be judged based on the total number of moles of those elements.

When, as described above, the concentrations of the $M_1$ element and the $M_2$ element change in at least one direction of the piezoelectric ceramics, and the increase and decrease directions of the concentration changes of the $M_1$ element and the $M_2$ element are directions opposite to each other, the extent of fluctuation in piezoelectric constant in the range of the Tmax±10° C. can be caused to fall within −15%, more preferably −10%, of dmax.

In the example of the disc-like ceramics shown in FIG. 4A, in the vicinity of the surface on one side of the plate plane where the concentration of the Ca element is relatively high and the concentration of the Zr element is relatively low, a site having a phase transition temperature of about 5° C. is locally formed as shown in FIG. 3B. On the other hand, in the vicinity of the surface on the opposite side, the concentration of the Ca element is relatively low and the concentration of the Zr element is relatively high, with the result that a site having a phase transition temperature of about 35° C. is locally formed as shown in FIG. 3C. Inside the disc, there is a local site that undergoes phase transition at an intermediate temperature therebetween. When such ceramics is placed at various ambient temperatures, a displacement obtained by combining the piezoelectric constants of those minute sites different in phase transition temperature is exhibited, and hence, as a result, a stable piezoelectric constant is obtained in a wide temperature range.

Such concentration change is seemingly achieved also by bonding the ceramics of FIG. 3B and FIG. 3C to each other after sintering instead of forming a single-piece piezoelectric ceramics. However, this case is unsuitable for a piezoelectric device requiring a resonance mode because piezoelectric vibrations of different modes generated in the respective ceramics are combined.

A case in which, as in the example of FIG. 4A, the piezoelectric ceramics of the present invention contains a plurality of regions different from each other in average composition in the form of layers is preferred because the extent of fluctuation in the piezoelectric constant can be further reduced. In the case of FIG. 4A, there are three layers of regions different from each other in average composition. When the composition changes in a stepwise manner instead of having uniform concentration changes, the effect increases because the difference between local phase transition temperatures increases even in the same average composition.

However, when raw materials are integrally sintered so as to form a single-piece ceramics, the migration (diffusion) of an element occurs, and hence a slight concentration gradient cannot be avoided. In that case, it is preferred that a plurality of regions each having a stable local phase transition temperature and a region in which the concentration abruptly changes for transition between the plurality of regions be stacked in the form of layers because transition between the local phase transition temperatures can occur in a stepwise manner. That is, it is preferred that the plurality of regions include at least three or more regions, including a first region in which the concentration change of at least one kind of the $M_1$ or the $M_2$ in a perpendicular direction of the layers is 5% or less, a second region in which the concentration change is 5% or more, and a third region in which the concentration change is 5% or less.

FIG. 5A, FIG. 5B, FIG. 5C, and FIG. 5D are graphs for showing the properties of piezoelectric elements using the piezoelectric ceramics shown as examples in FIG. 4A, FIG. 4B, FIG. 4C, and FIG. 4D, respectively.

Figure 5A:
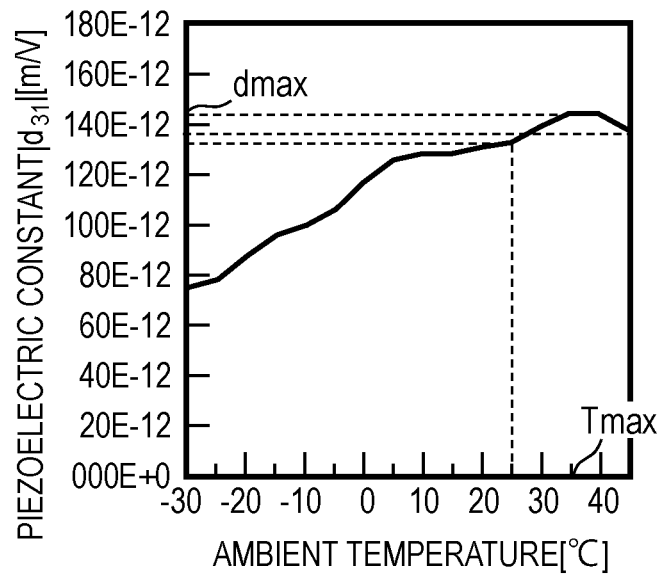
FIG. 5A, FIG. 5B, FIG. 5C, and FIG. 5D are each a graph for showing a relationship between the piezoelectric constant of a piezoelectric element of the present invention and an ambient temperature.

FIG. 5A is a graph for showing a relationship between the piezoelectric constant $|d_{31}|$ of a piezoelectric element using the piezoelectric ceramics having the concentration distributions of the $M_1$ element and the $M_2$ element shown in FIG. 4A, and an ambient temperature. For the purposes of enhancing the insulation property with respect to polarization treatment and maximizing the piezoelectric constant, a component for the Mn element has been added at 0.6 part by mol (on a metal basis) with respect to 100 parts by mol of the perovskite-type metal oxide of the average composition. The component for the Mn element has no concentration change in the ceramics.

As shown in FIG. 5A, the piezoelectric ceramics of the present invention manufactured under optimized sintering conditions has various piezoelectric constants depending on temperature at ambient temperatures of from −30° C. to 45° C. The change curve of the piezoelectric constant in FIG. 5A is data measured while increasing the ambient temperature after the piezoelectric ceramics that has been subjected to polarization treatment has been left to stand at an ambient temperature of −30° C. or less.

In FIG. 5A, the absolute value (dmax) of the largest piezoelectric constant in the range of from 0° C. or more to 40° C. or less is 143 pm/V, and the corresponding temperature Tmax is 35° C., corresponding to the temperature at which phase transition occurs from an orthorhombic crystal structure to a tetragonal crystal structure. The minimum piezoelectric constant in the range of Tmax±10° C. is 132 pm/V at a time when the temperature is increased to 25° C., and the change ratio therebetween is as small as (132-143)/143=−8.3%. When the change in piezoelectric constant in the practical temperature region is small as described above, the operation of a piezoelectric device is stabilized against temperature, and hence device design becomes easy.

The reduction of the change in piezoelectric constant itself can be achieved, without involving a concentration change, by, for example, further increasing the Ca concentration to further shift the phase transition temperature to a lower temperature. In that case, however, the dmax value in the practical temperature region decreases, and hence, for example, consumed electric power increases.

Figure 4B:
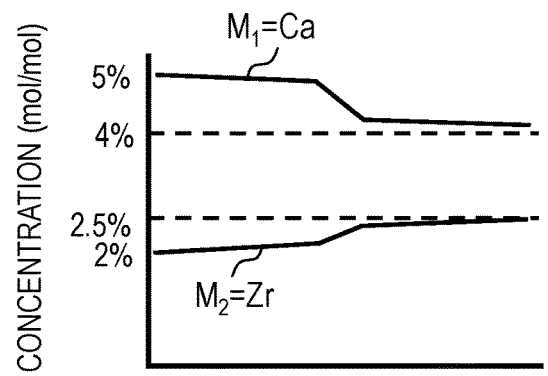

FIG. 4B is a graph for showing the concentration distributions of the Mi element and the $M_2$ element in the thickness direction of a disc-type single-piece piezoelectric ceramics containing as a main component a perovskite-type metal oxide represented by the compositional formula of $(Ba_{0.91}Ca_{0.09})(Ti_{0.955}Zr_{0.045})O_3$ as the average composition of the disc-like ceramics, serving as an example of another embodiment of the present invention.

As shown in FIG. 4B, the concentrations of the Ca element and the Zr element change in the thickness direction. There is no in-plane concentration gradient in the disc.

The concentration of $M_1$, namely, the Ca element monotonically decreases from 5 mol % at the left end of the chart to 4 mol % in three kinds of gradient modes, and the change ratios thereof are −2%, −25%, and −2% in order from the left.

The concentration of $M_2$, namely, the Zr element monotonically increases from 2 mol % at the left end of the chart to 2.5 mol % in three kinds of gradient modes, and the change ratios thereof are +5%, +35%, and +5% in order from the left. That is, the increase and decrease directions of the concentration changes of the $M_1$ element and the $M_2$ element are directions opposite to each other.

The piezoelectric ceramics of the present invention in FIG. 4B contains three layers (a plurality) of regions different from each other in average composition in the form of layers.

Figure 5B:
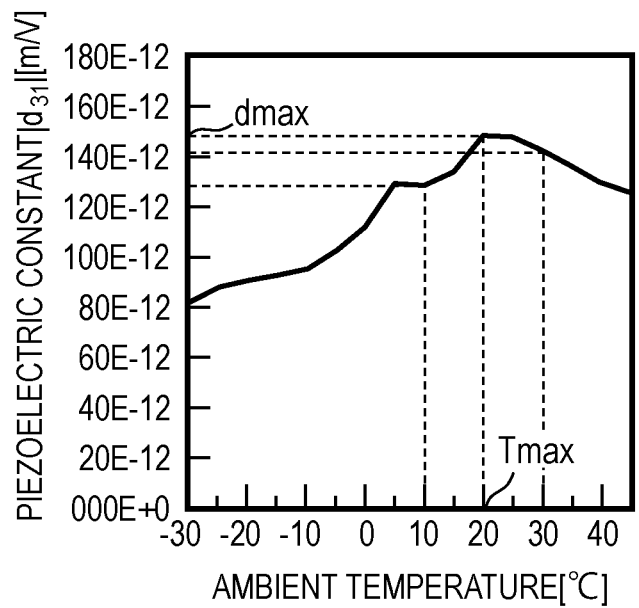

FIG. 5B is a graph for showing a relationship between the piezoelectric constant $|d_{31}|$ of a piezoelectric element using the piezoelectric ceramics having the concentration distributions of the $M_1$ element and the $M_2$ element shown in FIG. 4B, and an ambient temperature. A component for the Mn element has been added at 0.6 part by mol (on a metal basis) with respect to 100 parts by mol of the perovskite-type metal oxide of the average composition in the same manner as in FIG. 5A. The component for the Mn element has no concentration change in the ceramics. A measurement method for the change curve of the piezoelectric constant in FIG. 5B is the same as in FIG. 5A.

In FIG. 5B, the dmax value is 148 pm/V, and the corresponding temperature Tmax is 20° C. The minimum piezoelectric constant in the range of Tmax±10° C. is 129 pm/V at a time when the temperature is increased to 10° C., and the change ratio therebetween is as small as −13.0%.

Figure 4C:
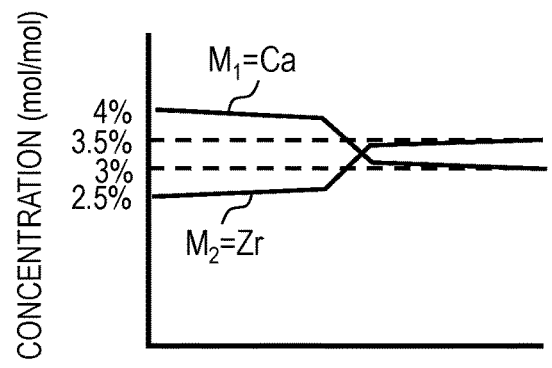

FIG. 4C is a graph for showing the concentration distributions of the $M_1$ element and the $M_2$ element in the thickness direction of a disc-type single-piece piezoelectric ceramics containing as a main component a perovskite-type metal oxide represented by the compositional formula of $(Ba_{0.93}Ca_{0.07})(Ti_{0.94}Zr_{0.06})O_3$ as the average composition of the disc-like ceramics, serving as an example of another embodiment of the present invention.

As shown in FIG. 4C, the concentrations of the Ca element and the Zr element change in the thickness direction. There is no in-plane concentration gradient in the disc.

The concentration of $M_1$, namely, the Ca element monotonically decreases from 4 mol % at the left end of the chart to 3 mol % in three kinds of gradient modes, and the change ratios thereof are −3.5%, −19%, and −3.5% in order from the left.

The concentration of $M_2$, namely, the Zr element monotonically increases from 2.5 mol % at the left end of the chart to 3.5 mol % in three kinds of gradient modes, and the change ratios thereof are +5%, +28%, and +5% in order from the left. That is, the increase and decrease directions of the concentration changes of the $M_1$ element and the $M_2$ element are directions opposite to each other.

The piezoelectric ceramics of the present invention in FIG. 4C contains three layers (a plurality) of regions different from each other in average composition in the form of layers.

Figure 5C:
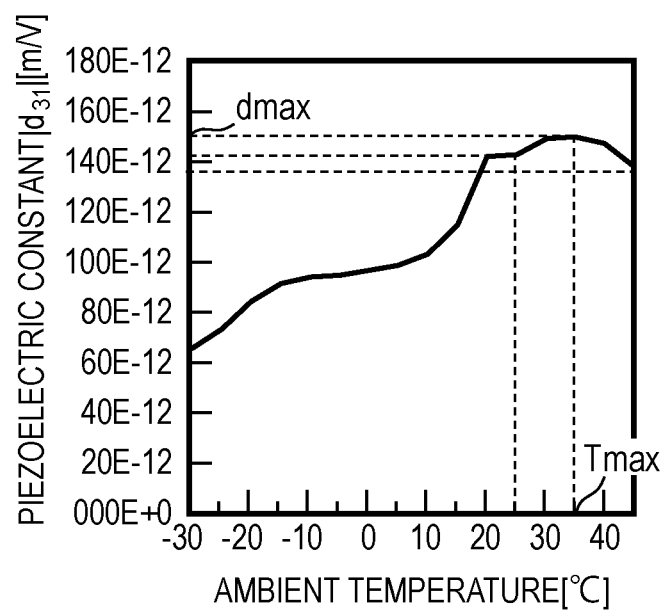

FIG. 5C is a graph for showing a relationship between the piezoelectric constant $|d_{31}|$ of a piezoelectric element using the piezoelectric ceramics having the concentration distributions of the $M_1$ element and the $M_2$ element shown in FIG. 4C, and an ambient temperature. A component for the Mn element has been added at 0.6 part by mol (on a metal basis) with respect to 100 parts by mol of the perovskite-type metal oxide of the average composition in the same manner as in FIG. 5A. The component for the Mn element has no concentration change in the ceramics. A measurement method for the change curve of the piezoelectric constant in FIG. 5C is the same as in FIG. 5A.

In FIG. 5C, the dmax value is 150 pm/V, and the corresponding temperature Tmax is 35° C. The minimum piezoelectric constant in the range of Tmax±10° C. is 138 pm/V at a time when the temperature is 45° C., and the change ratio therebetween is as small as −7.6%.

Figure 4D:
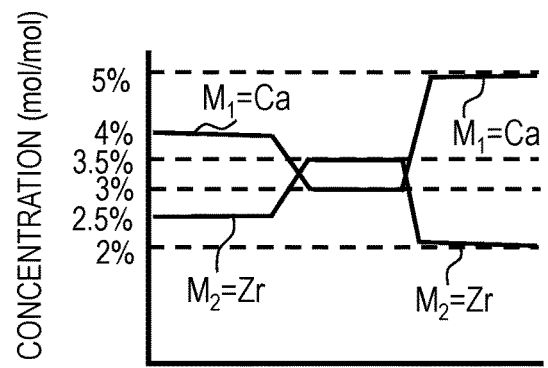

FIG. 4D is a graph for showing the concentration distributions of the $M_1$ element and the $M_2$ element in the thickness direction of a disc-type single-piece piezoelectric ceramics containing as a main component a perovskite-type metal oxide represented by the compositional formula of $(Ba_{0.92}Ca_{0.08})(Ti_{0.945}Zr_{0.055})O_3$ as the average composition of the disc-like ceramics, serving as an example of another embodiment of the present invention.

As shown in FIG. 4D, the concentrations of the Ca element and the Zr element change in the thickness direction. There is no in-plane concentration gradient in the disc.

The concentration of $M_1$, namely, the Ca element changes in five kinds of gradient modes of first decreasing from 4 mol % at the left end of the chart to 3 mol % and then increasing to 5 mol %, and the change ratios thereof are −3.5%, −19%, 0%, +35%, and +3% in order from the left.

The concentration of $M_2$, namely, the Zr element changes in five kinds of gradient modes of first increasing from 2.5 mol % at the left end of the chart to 3.5 mol % and then decreasing to 2 mol %, and the change ratios thereof are +5%, +28%, 0%, −60%, and −4% in order from the left. That is, the increase and decrease directions of the concentration changes of the $M_1$ element and the $M_2$ element are directions opposite to each other.

The piezoelectric ceramics of the present invention in FIG. 4D contains five layers (a plurality) of regions different from each other in average composition in the form of layers.

Figure 5D:
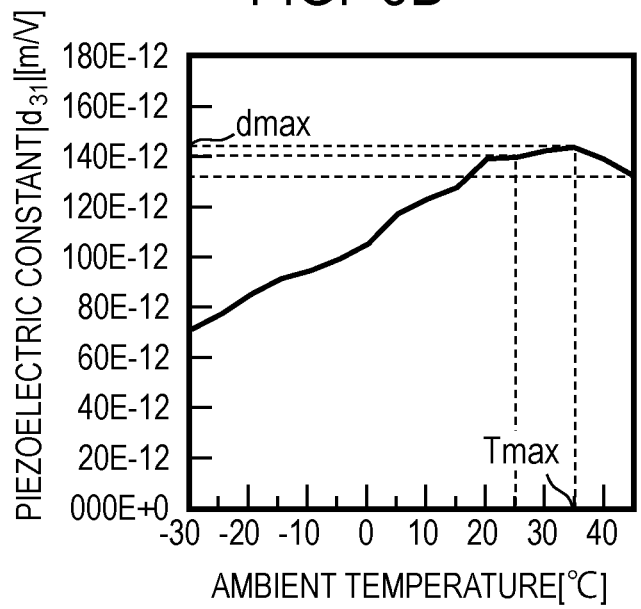

FIG. 5D is a graph for showing a relationship between the piezoelectric constant $|d_{31}|$ of a piezoelectric element using the piezoelectric ceramics having the concentration distributions of the $M_1$ element and the $M_2$ element shown in FIG. 4D, and an ambient temperature. A component for the Mn element has been added at 0.6 part by mol (on a metal basis) with respect to 100 parts by mol of the perovskite-type metal oxide of the average composition in the same manner as in FIG. 5A. The component for the Mn element has no concentration change in the ceramics. A measurement method for the change curve of the piezoelectric constant in FIG. 5D is the same as in FIG. 5A.

In FIG. 5D, the dmax value is 144 pm/V, and the corresponding temperature Tmax is 35° C. The minimum piezoelectric constant in the range of Tmax±10° C. is 134 pm/V at a time when the temperature is 45° C., and the change ratio therebetween is as small as −7.4%.

Although a manufacturing method for a piezoelectric ceramics having the features of the present invention is not particularly limited, a particularly preferred manufacturing method is described below.

The manufacturing method for a piezoelectric ceramics of the present invention has the following features.

(7) The manufacturing method includes a step of stacking a first ceramics precursor and a second ceramics precursor with each other to obtain a multilayered body.

(8) The manufacturing method includes a step of sintering the multilayered body to obtain a single-piece piezoelectric ceramics.

(9) In the selection of the first ceramics precursor and the second ceramics precursor, the following conditions are satisfied: $5°\ C. \leq |T_{otA}-T_{otB}| \leq 20°\ C.$ and $0 \leq 2|d_{31A}-d_{31B}|/|d_{31A}+d_{31B}| \leq 0.2$, where $T_{otA}$ and $T_{otB}$ represent respective orthorhombic-to-tetragonal phase transition temperatures of a first ceramics obtained by sintering the first ceramics precursor alone and a second ceramics obtained by sintering the second ceramics precursor alone, and $d_{31A}$ and $d_{31B}$ represent respective piezoelectric constants thereof after polarization treatment.

(Feature 7)

As illustrated in FIG. 1 and shown in FIG. 4A, FIG. 4B, FIG. 4C, and FIG. 4D, the piezoelectric ceramics having the features of the present invention may be a single-piece ceramics having portions different in composition in the form of layers. In order to produce a single-piece ceramics having such composition distribution, the first ceramics precursor and the second ceramics precursor are stacked with each other to produce a multilayered body before sintering.

The multilayered body refers to a solid substance formed from raw material powder or granulated powder of raw material powder, i.e., a so-called compact. That is, the ceramics precursors forming the multilayered body each refer to any one of raw material powder, granulated powder, or raw material powder-dispersed slurry containing the components of the piezoelectric ceramics that is the target product. The granulated powder and the dispersed slurry are products obtained by processing the raw material powder. The first ceramics precursor and the second ceramics precursor differ from each other in chemical composition. When a piezoelectric ceramics as shown in FIG. 4D is to be manufactured, it is appropriate to further add a third ceramics precursor having a different composition to the stack.

A case in which the first ceramics precursor and the second ceramics precursor each contain Ba and Ti is preferred because the piezoelectric constant of the piezoelectric ceramics after sintering is stably high against the ambient temperature.

The content ratio of Ba contained in each of the first ceramics precursor and the second ceramics precursor is preferably 40 mol % or more and 50 mol % or less with respect to the molar amount of all metals contained in the precursor. When the precursors each contain Ba in the range, the piezoelectric constant in the practical temperature region of the piezoelectric ceramics after sintering increases.

The content ratio of Ti contained in each of the first ceramics precursor and the second ceramics precursor is preferably 45 mol % or more and 50 mol % or less with respect to the molar amount of all metals contained in the precursor. When the precursors each contain Ti in the range, the piezoelectric constant in the practical temperature region of the piezoelectric ceramics after sintering increases.

The raw material powder to be contained in each of the first and second ceramics precursors preferably has a high purity. For example, when the ceramics precursors are each produced using only raw material powder having a purity of 99.9% or more, the lowering of the piezoelectric constant due to the influence of an unintentional impurity component can be avoided in the piezoelectric ceramics after sintering.

Examples of a metal compound that may be used for the raw material powder may include a Ba compound, a Ca compound, a Bi compound, a Ti compound, a Zr compound, a Sn compound, a Hf compound, a Mn compound, and composite compounds thereof.

Examples of the Ba compound that may be used include barium oxide, barium carbonate, barium oxalate, barium acetate, barium nitrate, barium titanate, barium zirconate, barium stannate, barium calcium titanate, and calcined composite powders of various metals.

Examples of the Ca compound that may be used include calcium oxide, calcium carbonate, calcium oxalate, calcium acetate, calcium titanate, calcium zirconate, calcium stannate, calcium zirconate titanate, barium calcium titanate, and calcined composite powders of various metals.

Examples of the Bi compound that may be used include bismuth oxide, bismuth nitrate, bismuth chloride, bismuth titanate, and calcined composite powders of various metals.

Examples of the Ti compound that may be used include titanium oxide, barium titanate, barium calcium titanate, bismuth titanate, and calcined composite powders of various metals.

Examples of the Zr compound that may be used include zirconium oxide, barium zirconate, calcium zirconate, barium zirconate titanate, calcium zirconate titanate, and calcined composite powder of various metals.

Examples of the Sn compound that may be used include tin oxide containing divalent or tetravalent Sn, barium stannate, calcium stannate, barium calcium stannate, and calcined composite powders of various metals.

Examples of the Hf compound that may be used include hafnium oxide, barium hafnate, and calcined composite powders of various metals.

Examples of the Mn compound that may be used include manganese oxide containing divalent to tetravalent Mn, manganese carbonate, manganese acetate, manganese oxalate, and calcined composite powders of various metals.

Raw material powder particularly desired for forming each of the ceramics precursors is powder of barium titanate, calcium titanate, barium zirconate, calcium zirconate, bismuth oxide, or manganese oxide. Such raw material powder can be obtained at a high purity, and moreover, has rich chemical reactivity for forming complex perovskite-type metal oxides forming a solid solution with each other.

The raw material powder may be subjected to calcining treatment at a maximum temperature of 800° C. or more and 1,000° C. or less before being used for granulation, slurrying, and forming.

When the ceramics precursors are to be obtained as granulated powders, the raw material powder is subjected to granulation treatment. When a multilayered body is manufactured by stacking granulated powders as the ceramics precursors, there is an advantage in that crystal grains of a sintered body using the multilayered body are likely to have a uniform size distribution. A method for the granulation treatment is not particularly limited. From the viewpoint that the particle diameters of the granulated powder can be made more uniform, a spray drying method is the most preferred granulation method. Examples of a binder that may be used in the granulation include polyvinyl alcohol (PVA), polyvinyl butyral (PVB), and an acrylic resin. The amount of the binder to be added is preferably from 1 part by weight to 10 parts by weight with respect to the raw material powder of the piezoelectric ceramics, and is more preferably from 2 parts by weight to 7 parts by weight from the viewpoint that the density of the compact increases.

A method of obtaining the ceramics precursors in dispersed slurry form is described later in the section for a manufacturing method for a piezoelectric element based on sheet forming.

A method of stacking the first and second ceramics precursors in powder form is not particularly limited, but the stacking may be performed by a technique involving, for example, sequentially loading the precursors in powder form into a mold for compressing and pressing a compact, followed by uniaxial pressing. When the first and second ceramics precursors in slurry form are to be stacked, the stacking may be performed by forming each of the first and second ceramics precursors into green sheets in advance and stacking a required number of sheets, followed by compression bonding.

In order to increase its density, the multilayered body is more preferably subjected to external pressing treatment, such as uniaxial pressing, cold isostatic pressing, or hot isostatic pressing.

(Feature 8)

The multilayered body is sintered to become a single-piece piezoelectric ceramics.

A method of sintering the multilayered body is not particularly limited.

Examples of the sintering method include sintering using an electric furnace, sintering using a gas furnace, a conduction heating method, a microwave sintering method, a millimeter-wave sintering method, and hot isostatic pressing (HIP). The electric furnace and the gas furnace for the sintering may each be a continuous furnace or a batch furnace.

A sintering temperature in the sintering method is not particularly limited, but is preferably a temperature at which each compound reacts to cause sufficient crystal growth. However, when the sintering is performed at an excessively high temperature, there is a risk in that the diffusion of the $M_1$ element and the $M_2$ element progresses excessively, with the result that a desired concentration distribution cannot be obtained.

When the viewpoint of causing the grain diameter of the ceramics to fall within the range of from 1 μm to 100 in which processability is good, is also taken into consideration in addition to the viewpoints of crystal growth and concentration distribution, the sintering temperature is preferably 1,150° C. or more and 1,400° C. or less, more preferably 1,250° C. or more and 1,360° C. or less. A piezoelectric ceramics sintered in the above-mentioned temperature range exhibits a satisfactory insulation property and a high piezoelectric constant. In order to stabilize the properties of the piezoelectric ceramics to be obtained by the sintering treatment with good reproducibility, it is appropriate that the sintering treatment be performed with the sintering temperature being set constant in the above-mentioned range for 1 hour or more and 48 hours or less, more preferably 2 hours or more and 24 hours or less. In addition, a sintering method such as a two-stage sintering method may be used, and a method that does not involve an abrupt temperature change is preferred in consideration of productivity.

(Feature 9)

The first ceramics precursor and the second ceramics precursor differ from each other in chemical composition, and it is a feature of the manufacturing method of the present invention that, in the preparation of the compositions, such compositions as to satisfy 5° C.≤|$T_{otA}-T_{otB}$|≤30° C. and 0≤2|$d_{31A}-d_{31B}$|/|$d_{31A}+d_{31B}$|≤0.2 are selected.

For example, when a single-piece piezoelectric ceramics having the composition distribution as shown in FIG. 4A is to be manufactured, such a raw material composition as to achieve the composition of $(Ba_{0.90}Ca_{0.10})(Ti_{0.96}Zr_{0.04})O_3$ after sintering is selected as the first ceramics precursor. For the adjustment of properties, the raw material composition for the first ceramics precursor may contain an auxiliary component, such as Mn. In addition, such a raw material composition as to achieve the composition of $(Ba_{0.94}Ca_{0.06})(Ti_{0.93}Zr_{0.07})O_3$ after sintering is selected as the second ceramics precursor. For the adjustment of properties, the raw material composition for the second ceramics precursor may contain an auxiliary component, such as Mn.

In this case, the orthorhombic-to-tetragonal phase transition temperature $T_{otA}$ of the first ceramics obtained by sintering the first ceramics precursor alone is 5° C. as can be read from the chart of FIG. 3B. The piezoelectric constant $d_{31A}$ after polarization treatment at the $T_{otA}$ is 160 pm/V. In addition, the orthorhombic-to-tetragonal phase transition temperature $T_{otB}$ of the second ceramics obtained by sintering the second ceramics precursor alone is 35° C. as can be read from the chart of FIG. 3C. The piezoelectric constant $d_{31B}$ after polarization treatment at the $T_{otB}$ is 169 pm/V. That is, such compositions as to satisfy (|$T_{otA}-T_{otB}$|=30° C. and 2|$d_{31A}-d_{31B}$|/|$d_{31A}+d_{31B}$|≤0.055 may be selected.

In order that, while the same base material, for example, a barium titanate-based material is used for each of the first ceramics precursor and the second ceramics precursor, $T_{otA}$ and $T_{otB}$ may differ by 5° C. or more and 30° C. or less and $d_{31A}$ and $d_{31B}$ may not differ too much, it is preferred that the first ceramics precursor and the second ceramics precursor each contain at least one element selected from the group consisting of Ca, Zr, Sn, Hf, and Bi. Ca and Bi each have an effect of shifting $T_{ot}$ to a lower temperature side depending on the substitution amount thereof. Zr, Sn, and Hf each have an effect of shifting $T_{ot}$ to a higher temperature side depending on the substitution amount thereof. In particular, the substitution of the T1 site with Zr is preferred because the degree of lowering of the Curie temperature of the piezoelectric ceramics is comparatively small.

When |$T_{otA}-T_{otB}$| is 5° C. or more, the following effect is obtained: the change ratio of the piezoelectric constant in the range of Tmax±10° C. is remarkably smaller than that of a piezoelectric ceramics obtained from a single ceramics precursor. In addition, when |$T_{otA}-T_{otB}$| is 30° C. or less, a large piezoelectric constant can be obtained as a whole in the range of Tmax±10° C. A more preferred range of |$T_{otA}-T_{otB}$| is from 10° C. or more to 30° C. or less.

In addition, in order to cause Tmax to fall within the practical temperature region of the piezoelectric ceramics, it is preferred that the average value of $T_{otA}$ and $T_{otB}$, namely, ($T_{otA}+T_{otB}$)/2 be 0° C. or more and 30° C. or less. It is more preferred that ($T_{otA}+T_{otB}$)/2 be 10° C. or more and 30° C. or less.

(Piezoelectric Element)

Next, the piezoelectric element of the present invention is described.

Figure 6:
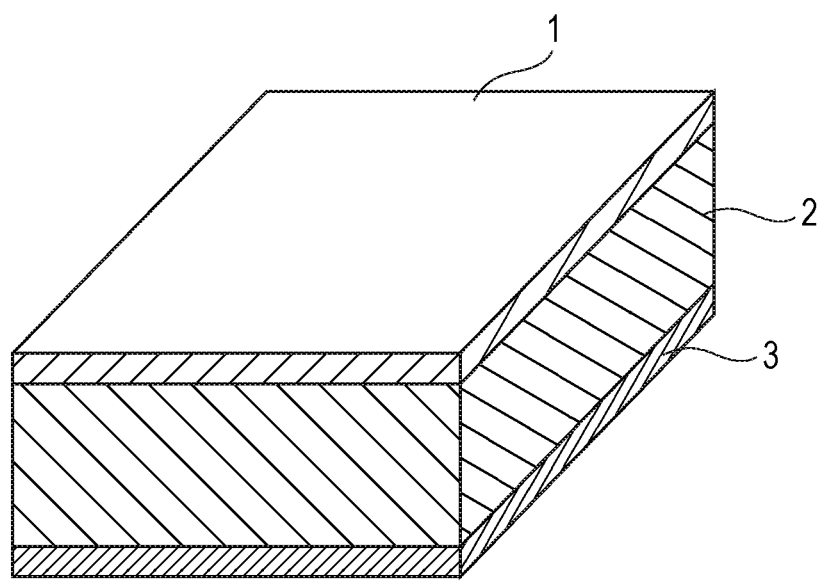
FIG. 6 is a schematic view for illustrating a piezoelectric element according to one embodiment of the present invention.

FIG. 6 is a schematic view for illustrating the configuration of a piezoelectric element according to one embodiment of the present invention. The piezoelectric element according to the present invention includes at least a first electrode 1, a piezoelectric ceramics portion 2, and a second electrode 3, in which a piezoelectric ceramics for forming the piezoelectric ceramics portion 2 is the piezoelectric ceramics of the present invention.

The piezoelectric property of the piezoelectric ceramics of the present invention may be evaluated by forming the piezoelectric element including at least the first electrode 1 and the second electrode 3. The first electrode 1 and the second electrode 3 are each formed of a conductive layer having a thickness of from about 5 nm to about 10 μm. A material therefor is not particularly limited, and only needs to be one to be generally used for a piezoelectric element. Examples thereof may include metals, such as Ti, Pt, Ta, Ir, Sr, In, Sn, Au, Al, Fe, Cr, Ni, Pd, Ag, and Cu, and compounds thereof.

Each of the first electrode 1 and the second electrode 3 may be formed of one kind of those materials, or may be obtained by stacking two or more kinds thereof. In addition, the first electrode 1 and the second electrode 3 may be formed of materials different from each other.

A production method for each of the first electrode 1 and the second electrode 3 is not limited. The first electrode 1 and the second electrode 3 may each be formed by baking a metal paste or by sputtering, vapor deposition, or the like. In addition, both the first electrode 1 and the second electrode 3 may be patterned in desired shapes before use.

(Polarization)

It is more preferred that the piezoelectric element have spontaneous polarization axes aligned in a certain direction.

When the spontaneous polarization axes are aligned in a certain direction, the piezoelectric constant of the piezoelectric element increases.

A polarization method for the piezoelectric element is not particularly limited. The polarization treatment may be performed in the air or may be performed in silicone oil. A temperature at which the polarization is performed is preferably a temperature of from 60° C. to 150° C. However, optimum conditions slightly vary depending on the composition of the piezoelectric ceramics for forming the element. An electric field to be applied for performing the polarization treatment is preferably from 800 V/mm to 3.0 kV/mm.

(Multilayered Piezoelectric Element)

Next, a multilayered piezoelectric element serving as one embodiment of the piezoelectric element is described.

In the multilayered piezoelectric element according to the present invention, the piezoelectric ceramics portion 2 includes at least one internal electrode, and the piezoelectric element has a multilayered structure in which piezoelectric ceramics layers each formed of the piezoelectric ceramics and the at least one internal electrode in a form of a layer are alternately stacked.

Figure 7A:
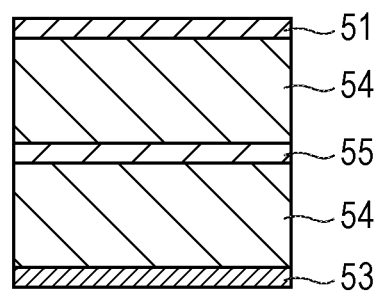
FIG. 7A and FIG. 7B are each a schematic view for illustrating a piezoelectric element having a multilayered structure according to one embodiment of the present invention.
Figure 7B:
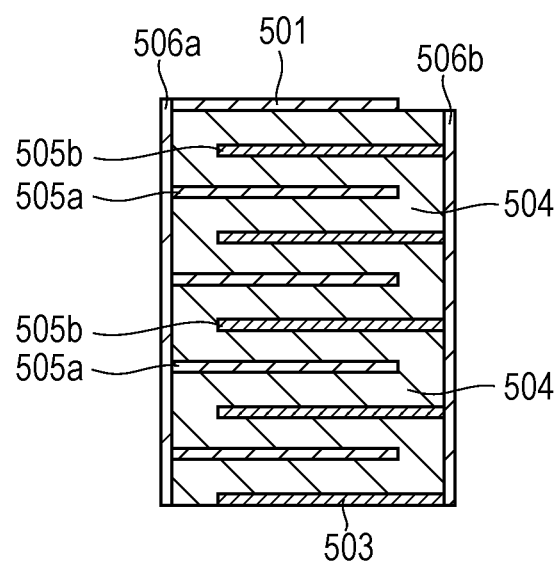

FIGS. 7A and 7B are each a cross-sectional schematic view for illustrating the configuration of a multilayered piezoelectric element according to one embodiment of the present invention. The multilayered piezoelectric element according to the present invention includes piezoelectric ceramics layers 54, 504, and an electrode layer including an internal electrode 55, 505, which are alternately stacked. In the multilayered piezoelectric element, the piezoelectric ceramics layers 54, 504 are each formed of the piezoelectric ceramics of the present invention.

That is, in each of the piezoelectric ceramics layers 54, 504, the concentrations of the $M_1$ element and the $M_2$ element change in directions opposite to each other.

The electrode layer may include external electrodes, such as a first electrode 51, 501 and a second electrode 53, 503, in addition to the internal electrode 55, 505.

FIG. 7A is an illustration of the configuration of the multilayered piezoelectric element of the present invention in which two layers of the piezoelectric ceramics layers 54 and one layer of the internal electrode 55 are alternately stacked, and the multilayered structure is sandwiched between the first electrode 51 and the second electrode 53. As illustrated in FIG. 7B, the numbers of the piezoelectric ceramics layers 504 and internal electrodes 505a and 505b may be increased, and the numbers of the layers are not limited. In the multilayered piezoelectric element of FIG. 7B, nine layers of the piezoelectric ceramics layers 504 and eight layers of the internal electrodes 505 (505a or 505b) are alternately stacked. The multilayered structure has a configuration in which the piezoelectric ceramics layers 504 are sandwiched between the first electrode 501 and the second electrode 503, and includes an external electrode 506a and an external electrode 506b for short-circuiting the alternately formed internal electrodes.

The internal electrodes 55, 505a, and 505b, the external electrodes 506a and 506b, the first electrodes 51 and 501, and the second electrodes 53 and 503 do not need to be identical in size and shape to the piezoelectric ceramics layers 54 and 504, and may each be divided into a plurality of portions.

The internal electrodes 55 and 505, the external electrodes 506a and 506b, the first electrodes 51 and 501, and the second electrodes 53 and 503 are each formed of a conductive layer having a thickness of from about 5 nm to about 10 μm. A material for each of the electrodes is not particularly limited and only needs to be one to be generally used for a piezoelectric element. Examples thereof may include metals, such as Ti, Pt, Ta, Ir, Sr, In, Sn, Au, Al, Fe, Cr, Ni, Pd, Ag, and Cu, and compounds thereof. Each of the internal electrodes 55 and 505 and the external electrodes 506a and 506b may be formed of one kind thereof, may be formed of a mixture or alloy of two or more kinds, or may be formed of a multilayered body of two or more kinds thereof. In addition, a plurality of electrodes may be respectively formed of materials different from each other.

In the multilayered piezoelectric element using the piezoelectric ceramics of the present invention, the internal electrode 55, 505 contains Ag and Pd, and a weight ratio $M_{Ag}/M_{Pd}$ between the content weight $M_{Ag}$ of the Ag and the content weight $M_{Pd}$ of the Pd preferably falls within the range of $1.5 \leq M_{Ag}/M_{Pd} \leq 9.0$. A case in which the weight ratio $M_{Ag}/M_{Pd}$ is less than 1.5 is not desired because the increase of the Pd component increases electrode cost, though the heat resistance of the internal electrode 55, 505 is high. Meanwhile, a case in which the weight ratio $M_{Ag}/M_{Pd}$ is more than 9.0 is not desired because, owing to the lack of the heat-resistant temperature of the internal electrode, the internal electrode is formed in an island shape, resulting in in-plane non-uniformity. From the viewpoints of heat resistance and cost, the weight ratio $M_{Ag}/M_{Pd}$ more preferably falls within the range of $2.0 \leq M_{Ag}/M_{Pd} \leq 5.0$.

From the viewpoint that an electrode material is inexpensive, it is preferred that the internal electrode 55, 505 contain at least any one kind selected from the group consisting of Ni and Cu. When at least any one kind selected from the group consisting of Ni and Cu is used for the internal electrode 55, 505, the multilayered piezoelectric element of the present invention is preferably fired in a reducing atmosphere.

As illustrated in FIG. 7B, a plurality of electrodes including the internal electrodes 505 may be short-circuited to each other for the purpose of making the phases of their driving voltages uniform. For example, the internal electrode 505a and the first electrode 501 may be short-circuited through the external electrode 506a. The internal electrode 505b and the second electrode 503 may be short-circuited through the external electrode 506b. The internal electrode 505a and the internal electrode 505b may be alternately arranged. In addition, a mode in which the electrodes are short-circuited to each other is not limited. An electrode or wiring for short-circuiting may be provided on a side surface of the multilayered piezoelectric element, or the electrodes may be short-circuited to each other by forming a through-hole passing through the piezoelectric ceramics layers 504 and arranging a conductive material inside the through-hole.

(Manufacturing Method for Piezoelectric Element or Multilayered Piezoelectric Element based on Sheet Forming)

Although a manufacturing method for the multilayered piezoelectric element according to the present invention is not particularly limited, a production method therefor is exemplified below. First, a step (A) of obtaining each of a slurry 1 serving as the first ceramics precursor and a slurry 2 serving as the second ceramics precursor from metal oxide powder, and a step (B) including separately placing the slurry 1 and the slurry 2 on base materials to form sheets, and integrating the sheets to obtain a compact are performed. After that, a step (C) of forming electrodes on the compact and a step (D) of sintering the compact having the electrodes formed thereon to obtain a multilayered piezoelectric element are performed.

In this case, when the step (C) is omitted and external electrodes are formed after the sintering of the step (D), a single plate-type piezoelectric element as illustrated in FIG. 6 can be obtained.

The metal oxide powder that may be used in the step (A) is as exemplified as the raw material powder. A method of selecting each of the compositions of the slurry 1 and the slurry 2 is as described in the feature (9). The metal oxide powder is more preferably subjected to calcining treatment at a maximum temperature of 800° C. or more and 1,200° C. or less before being slurried.

A method of preparing each of the slurries in the step (A) is exemplified. A solvent is added in a weight of 1.6-fold to 1.7-fold with respect to the metal compound powder, followed by mixing. As the solvent, for example, toluene, ethanol, a mixed solvent of toluene and ethanol, n-butyl acetate, or water may be used. The components are mixed in a ball mill for 24 hours, and then minute amounts of the binder and the plasticizer are added.

Examples of the binder include polyvinyl alcohol (PVA), polyvinyl butyral (PVB), and an acrylic resin. Examples of the plasticizer include dioctyl sebacate, dioctyl phthalate, and dibutyl phthalate. When dibutyl phthalate is used as the plasticizer, equal weights of dibutyl phthalate and the binder are weighed. Then, mixing in a ball mill is performed again overnight. The amounts of the solvent and the binder are adjusted so that the viscosity of each of the slurries is from 300 mPa·s to 500 mPa·s.

The sheets in the step (B) are each a sheet-shaped mixture of the metal compound powder, the binder, and the plasticizer. As a method of obtaining each of the sheets in the step (B), for example, there is given sheet forming. For example, a doctor blade method may be used for the sheet forming. The doctor blade method is a method of forming a sheet-shaped compact involving applying the slurry onto the base material with a doctor blade and drying the applied slurry.

As each of the base materials, for example, a PET film may be used. It is desired that the surface of the PET film onto which the slurry is applied be coated with, for example, fluorine because the coating facilitates the peeling of the compact. The drying may be natural drying or hot-air drying. The thickness of the compact is not particularly limited, and may be adjusted depending on the thickness of the multilayered piezoelectric element. The thickness of the compact may be increased by, for example, increasing the viscosity of each of the slurries.

A sheet 1 obtained from the slurry 1 and a sheet 2 obtained from the slurry 2 are stacked and subjected to compression bonding to be used as one sheet in the next step (C). In order to adjust a thickness after the sintering, a stack of a plurality of the sheets 1 and a stack of a plurality of the sheets 2 may be subjected to compression bonding. As a method for the compression bonding, there are given uniaxial pressing, cold isostatic pressing, and hot isostatic pressing.

A production method for each of the electrodes in the step (C), that is, the internal electrodes 505 and the external electrodes 506a and 506b is not limited. The electrodes may each be formed by baking a metal paste or by sputtering, vapor deposition, a printing method, or the like. For the purpose of reducing a driving voltage, the layer thicknesses and pitch interval of the piezoelectric ceramics layers 504 are reduced in some cases. In that case, there is selected a process involving forming a multilayered body including precursors for the piezoelectric ceramics layers 504 and the internal electrodes 505a and 505b, and then firing the multilayered body simultaneously. In that case, there is demanded an internal electrode material that does not undergo deformation or conductivity deterioration at a temperature required for sintering the piezoelectric ceramics layers 504. A metal that has a low melting point and is inexpensive as compared to Pt, such as Ag, Pd, Au, Cu, or Ni, or an alloy thereof may be used for each of the internal electrodes 505a and 505b and the external electrodes 506a and 506b. In this connection, the external electrodes 506a and 506b may be formed after the firing of the multilayered body. In that case, Al or a carbon-based electrode material may be used in addition to Ag, Pd, Cu, or Ni.

A method of forming each of the electrodes is desirably a screen printing method. The screen printing method is a method involving placing a screen printing plate on a compact placed on a base material and applying a metal paste with a spatula from above the screen printing plate. A screen mesh is formed on at least part of the screen printing plate. Thus, the metal paste at a portion on which the screen mesh is formed is applied onto the compact. The screen mesh in the screen printing plate desirably has a pattern formed therein. An electrode may be patterned onto the compact by transferring the pattern onto the compact through the use of the metal paste.

After the formation of the electrodes in the step (C), one or a plurality of sheets of the compact peeled from the base material are stacked and subjected to compression bonding. As a method for the compression bonding, there are given uniaxial pressing, cold isostatic pressing, and hot isostatic pressing. The hot isostatic pressing is desired because a pressure can be applied isotropically and uniformly. It is desired to heat the compact to around the glass transition temperature of the binder during the compression bonding because more satisfactory compression bonding can be achieved. A plurality of sheets of the compact may be stacked and subjected to compression bonding so as to achieve a desired thickness. For example, 5 to 100 sheets of the compact may be stacked and then subjected to thermo-compression bonding involving applying a pressure of from 10 MPa to 60 MPa in a stacking direction over 10 seconds to 10 minutes at from 50° C. to 80° C., to thereby stack the sheets of the compact. In addition, a plurality of sheets of the compact may be aligned and stacked with good accuracy by providing the electrodes with alignment marks. Of course, a plurality of sheets of the compact may also be stacked with good accuracy by forming a through-hole for positioning in the compact.

The sintering temperature of the compact in the step (D) is not particularly limited, but is preferably a temperature at which each compound reacts to cause sufficient crystal growth. A preferred sintering temperature is 1,100° C. or more and 1,400° C. or less, more preferably 1,150° C. or more and 1,300° C. or less, from the viewpoint of causing the grain diameter of the ceramics to fall within the range of from 0.2 μm to 50 μm. A multilayered piezoelectric element sintered in the above-mentioned temperature range exhibits satisfactory piezoelectric performance.

However, when a material containing Ni as a main component is used for each of the electrodes in the step (C), the step (D) is preferably performed in a furnace capable of atmosphere firing. The binder is removed by combustion at a temperature of from 200° C. to 600° C. in an air atmosphere, and then the atmosphere is changed to a reducing atmosphere, in which sintering is performed at a temperature of from 1,200° C. to 1,550° C. The term "reducing atmosphere" as used herein refers to an atmosphere mainly formed of a mixed gas of hydrogen (H2) and nitrogen (N2). A volume ratio between hydrogen and nitrogen preferably falls within the range of from H2:N2=1:99 to H2:N2=10:90.

In addition, the mixed gas may contain oxygen. The oxygen concentration thereof when the total pressure of the mixed gas is 1 Pa is $10^{-12}$ Pa or more and $10^{-4}$ Pa or less, more preferably $10^{-8}$ Pa or more and $10^{-5}$ Pa or less. The oxygen concentration may be measured with a zirconia-type oxygen sensor. When a Ni electrode is used, the multilayered piezoelectric element of the present invention can be inexpensively manufactured. After firing in the reducing atmosphere, it is preferred that the temperature be decreased to 600° C., the atmosphere be replaced with an air atmosphere (oxidizing atmosphere), and oxidation treatment be performed. After removal from the firing furnace, a conductive paste is applied to a side surface of the compact on which end portions of the internal electrodes are exposed, followed by drying, to form external electrodes.

(Vibration Device, and Image Pickup Apparatus serving as Electronic Device)

Figure 8A:
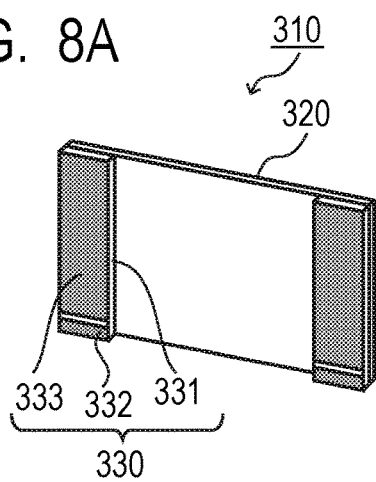
FIG. 8A, FIG. 8B, FIG. 8C, and FIG. 8D are schematic views for illustrating a vibration device and electronic device according to one embodiment of the present invention.
Figure 8B:
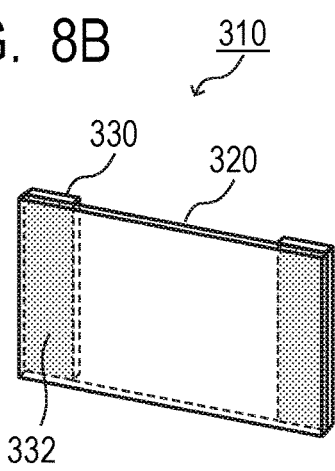
Figure 8C:
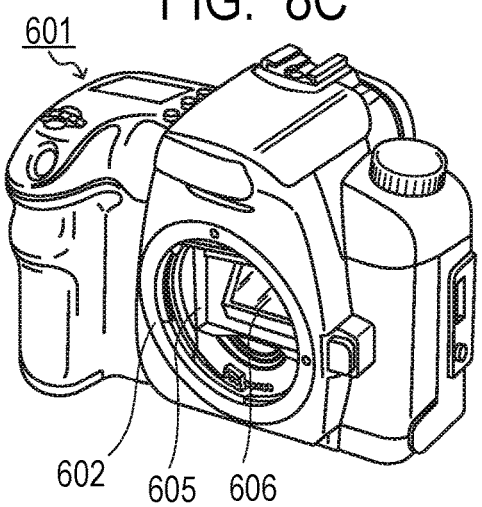
Figure 8D:
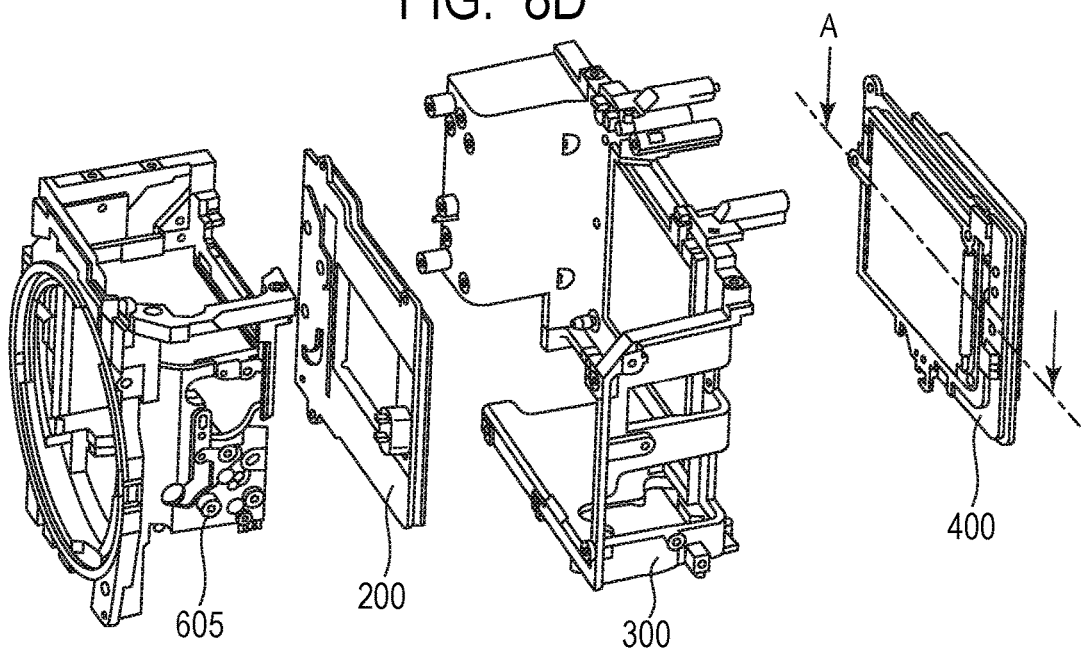

FIG. 8A, FIG. 8B, FIG. 8C, and FIG. 8D are schematic views for schematically illustrating the configurations of a vibration device including the piezoelectric element of the present invention and an image pickup apparatus serving as an electronic device using the vibration device. The vibration device illustrated in FIG. 8A and FIG. 8B is a dust removing device including at least a vibration body including a diaphragm including the piezoelectric element of the present invention, the dust removing device having a function of removing dust sticking to the surface of the diaphragm. The electronic device according to the present invention includes the piezoelectric element of the present invention, and the image pickup apparatus illustrated in FIG. 8C and FIG. 8D is an image pickup apparatus including at least the dust removing device and an image pickup element unit, in which the diaphragm of the dust removing device is arranged on a light receiving plane side of the image pickup element unit.

The shapes and arrangement of the members are not limited to the examples of FIG. 8A, FIG. 8B, FIG. 8C, and FIG. 8D.

FIG. 8A and FIG. 8B are schematic views for illustrating a vibration device serving as a dust removing device according to one embodiment. A dust removing device 310 includes a plate-like piezoelectric element 330 and a diaphragm 320. The piezoelectric element 330 may be the multilayered piezoelectric element of the present invention. A material for the diaphragm 320 is not limited. In the case where the dust removing device 310 is used for an optical device, a light-transmissive material or a light-reflective material may be used as the diaphragm 320, and a light-transmissive portion or light-reflective portion of the diaphragm 320 is subjected to dust removal.

The piezoelectric element 330 includes a piezoelectric ceramics 331, a first electrode 332, and a second electrode 333, and the first electrode 332 and the second electrode 333 are arranged so as to be opposed to each other on the plate planes of the piezoelectric ceramics 331. In the case of the multilayered piezoelectric element, the piezoelectric ceramics 331 has an alternate structure of a piezoelectric ceramics layer and an internal electrode, and can provide driving waveforms different from each other in phase depending on layers of the piezoelectric ceramics by short-circuiting the internal electrode with the first electrode 332 or the second electrode 333 alternately. In FIG. 8A, the first electrode 332 extends around to the side on which the second electrode 333 is present.

When an alternating voltage is externally applied to the piezoelectric element 330, a stress is generated between the piezoelectric element 330 and the diaphragm 320 to generate out-of-plane oscillation in the diaphragm 320. The dust removing device 310 is a device configured to remove foreign matter, such as dust, sticking to the surface of the diaphragm 320 by the out-of-plane oscillation of the diaphragm 320. The out-of-plane oscillation refers to elastic vibration in which the diaphragm is displaced in an optical axis direction, namely in the thickness direction of the diaphragm.

Next, an image pickup apparatus using the dust removing device is described.

The image pickup apparatus may also be said to be an example of the electronic device of the present invention. In FIG. 8C and FIG. 8D, an image pickup apparatus serving as a digital single-lens reflex camera is illustrated.

FIG. 8C is a front side perspective view of a camera main body 601 viewed from an object side, for illustrating a state in which an imaging lens unit is removed. FIG. 8D is an exploded perspective view for illustrating an internal schematic configuration of the camera, for describing a peripheral structure of the dust removing device and an image pickup unit 400.

In the camera main body 601 illustrated in FIG. 8C, a mirror box 605 configured to guide an imaging light beam that has passed through an imaging lens is arranged, and a main mirror (quick return mirror) 606 is arranged in the mirror box 605. The main mirror 606 may take each of: a state of being held at an angle of 45° with respect to an imaging optical axis in order to guide the imaging light beam in the direction of a penta-Dach mirror (not shown); and a state of being held at a position retreated from the imaging light beam in order to guide the imaging light beam in the direction of an image pickup element (not shown).

In FIG. 8D, on the object side of a main body chassis 300 serving as a framework of the camera main body, the mirror box 605 and a shutter unit 200 are arranged in order from the object side. In addition, on the photographer side of the main body chassis 300, the image pickup unit 400 is arranged. The image pickup unit 400 includes the diaphragm 320 of the dust removing device 310 and an image pickup element unit. In addition, the diaphragm 320 of the dust removing device 310 and the light receiving plane of the image pickup element unit are sequentially arranged on the same axis. The image pickup unit 400 is arranged on the mounting surface of a mount portion 602 (FIG. 8C) serving as a reference for mounting the imaging lens unit, and is adjusted so that the image pickup surface of the image pickup element unit may be parallel to an image pickup lens unit at a predetermined distance.

Herein, the digital single-lens reflex camera has been described as an example of the image pickup apparatus, but the image pickup apparatus may be a camera with an interchangeable imaging lens unit, such as a mirrorless digital single-lens camera without the mirror box 605. In addition, the present invention may also be applied to various types of image pickup apparatus or electronic and electric devices including the image pickup apparatus, such as a video camera with an interchangeable imaging lens unit, a copying machine, a facsimile, and a scanner, in particular, a device that is required to remove dust sticking to the surface of an optical component.

(Other Electronic Device Examples 1: Liquid Ejection Head and Liquid Ejection Apparatus)

Figure 9A:
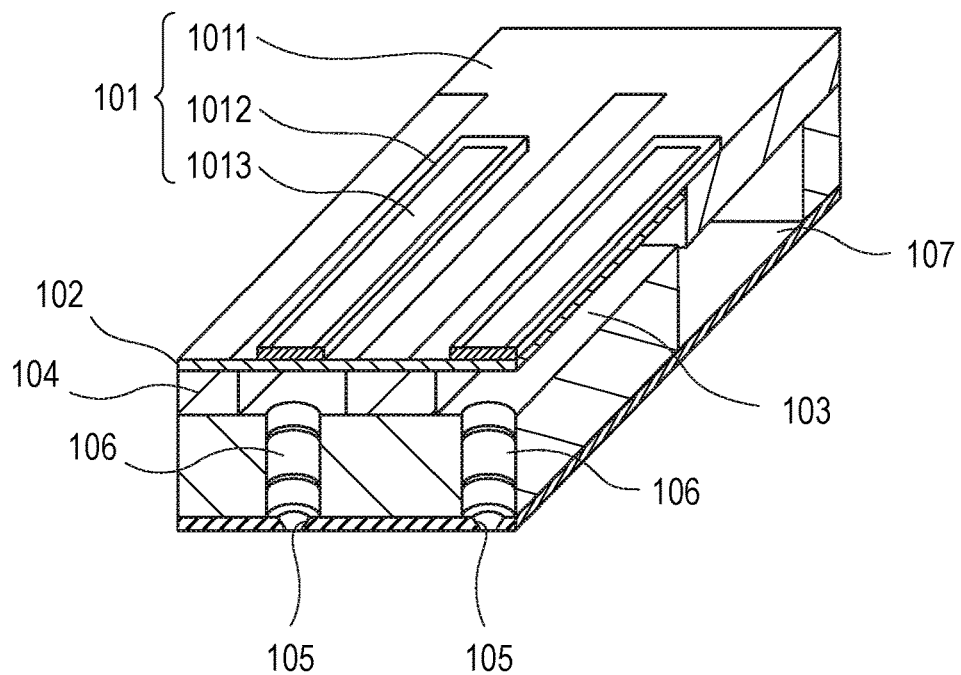
FIG. 9A and FIG. 9B are each a schematic view for illustrating an electronic device according to one embodiment of the present invention.
Figure 9B:
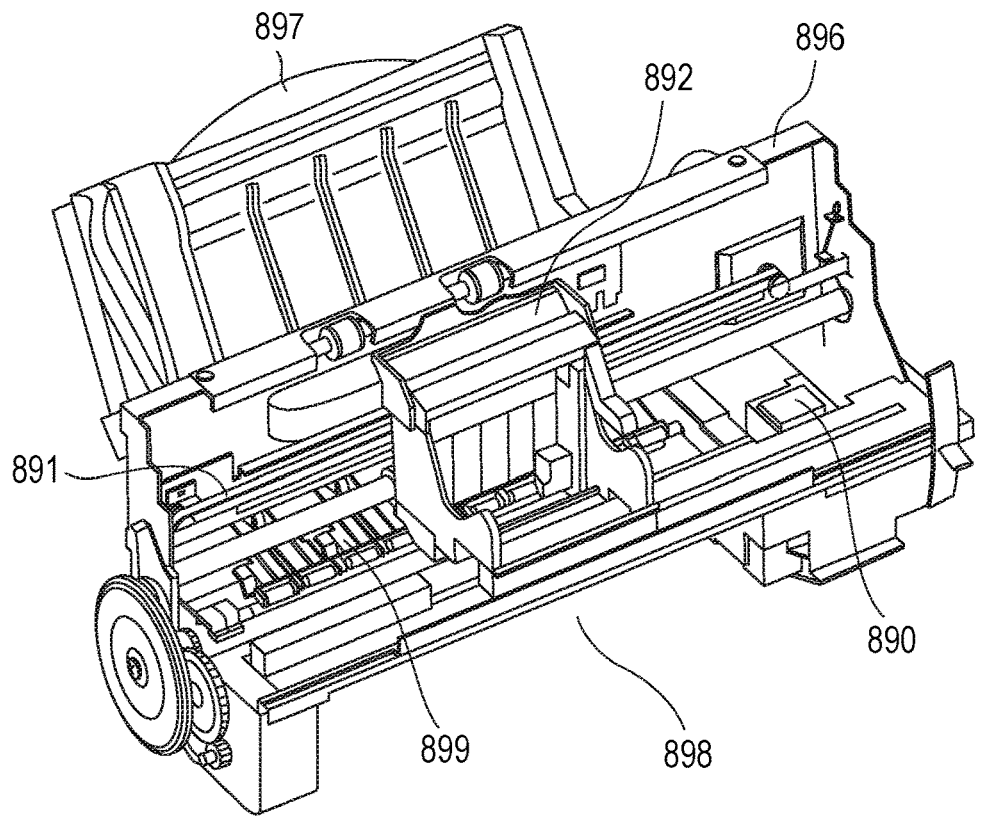

FIG. 9A and FIG. 9B are schematic views for schematically illustrating the configurations of a liquid ejection head including the piezoelectric element of the present invention and a liquid ejection apparatus using the liquid ejection head, as examples of the electronic device of the present invention. The liquid ejection head includes at least a liquid chamber including a vibration unit including the piezoelectric element or the multilayered piezoelectric element, and a discharge port communicating to the liquid chamber. The liquid ejection apparatus includes a transfer material-carrying unit and the liquid ejection head. The shapes and arrangement of the members are not limited to the examples of FIG. 9A and FIG. 9B.

As illustrated in FIG. 9A, the liquid ejection head serving as the electronic device of the present invention includes a piezoelectric element 101 of the present invention. The piezoelectric element 101 includes at least a first electrode 1011, a piezoelectric ceramics 1012, and a second electrode 1013. The piezoelectric ceramics 1012 and the second electrode 1013 may be patterned for the purpose of increasing the discharge capacity of the liquid ejection head.

The liquid ejection head includes discharge ports 105, independent liquid chambers 103, communicating holes 106 for connecting the independent liquid chambers 103 and the discharge ports 105, liquid chamber partition walls 104, a common liquid chamber 107, a diaphragm 102, and the piezoelectric element 101. In general, the piezoelectric ceramics 1012 has a shape in conformity with the shape of the independent liquid chamber 103.

When the liquid ejection head serving as an example of the electronic device of the present invention is driven by inputting an electric signal thereinto, the diaphragm 102 vibrates up and down in accordance with the deformation of the piezoelectric element 101 to apply a pressure to a liquid stored in each of the independent liquid chambers 103. As a result, the liquid is discharged from each of the discharge ports 105. The liquid ejection head may be used for incorporation into a printer configured to perform printing on various media or manufacture of an electronic device.

Next, a liquid ejection apparatus using the liquid ejection head is described.

The liquid ejection apparatus may also be said to be an example of the electronic device of the present invention. In FIG. 9B, a liquid ejection apparatus serving as an ink jet recording apparatus is illustrated.

The liquid ejection apparatus of FIG. 9B includes various mechanisms incorporated into the inside of an exterior 896. An automatic sheet feeder unit 897 has a function of automatically feeding a recording sheet as a transfer material into a device main body. The recording sheet fed from the automatic sheet feeder unit 897 is guided to a predetermined recording position by a conveyance unit 899, and after a recording operation, is guided again by the conveyance unit 899 from the recording position to a delivery portion 898. The conveyance unit 899 serves as a transfer material-carrying unit. The liquid ejection apparatus includes, in addition to the foregoing, a recording unit 891 configured to perform recording on the recording sheet conveyed to the recording position, and a recovery unit 890 configured to perform a recovery process on the recording unit 891. The recording unit 891 includes a carriage 892 in which the liquid ejection head is housed to be reciprocated on a rail.

In such liquid ejection apparatus, the carriage 892 carries the liquid ejection head in accordance with an instruction from an external computer, and ink is discharged from the discharge ports 105 of the liquid ejection head in response to a voltage applied to the piezoelectric element 101. Thus, printing is performed.

In the example described above, the printer is exemplified. However, the liquid ejection apparatus of the present invention may be used as a printing apparatus, such as an ink jet recording apparatus, e.g., a facsimile, a multifunctional peripheral, or a copying machine, or as an industrial liquid ejection apparatus or a drawing apparatus for an object. In addition, a user may select a desired transfer material depending on applications.

(Other Electronic Device Examples 2: Vibration Wave Motor and Optical Device)

FIG. 10A, FIG. 10B, FIG. 10C, FIG. 10D, and FIG. 10E are schematic views for schematically illustrating the configurations of a vibration wave motor including the piezoelectric element of the present invention and an optical device using the vibration wave motor, as examples of the electronic device of the present invention. The vibration wave motor includes at least a vibration body including the piezoelectric element or the multilayered piezoelectric element, and a moving body to be brought into contact with the vibration body. The optical device includes a drive unit including the vibration wave motor. The shapes and arrangement of the members are not limited to the examples of FIG. 10A, FIG. 10B, FIG. 10C, FIG. 10D, and FIG. 10E.

Figure 10A:
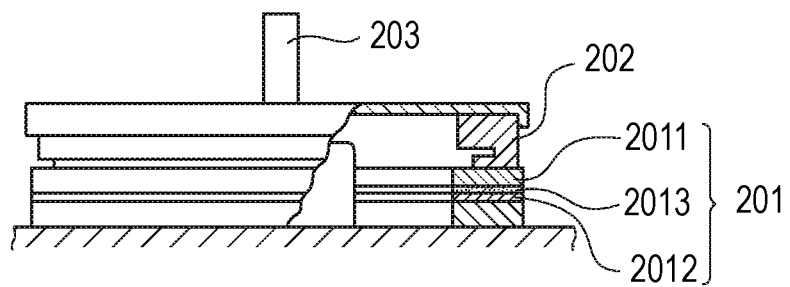
FIG. 10A and FIG. 10B are each a schematic view for illustrating a vibration wave motor serving as an electronic device according to one embodiment of the present invention.

FIG. 10A is an illustration of a vibration wave motor in which the piezoelectric element of the present invention is formed of a single plate. The vibration wave motor includes a vibration body 201, a moving body 202 (also referred to as rotor), which is brought into contact with the sliding surface of the vibration body 201 with a pressure applied by a pressurizing spring (not shown), and an output shaft 203 arranged so as to be integrated with the moving body 202. The vibration body 201 is formed of a metal elastic ring 2011, a piezoelectric element 2012 of the present invention, and an organic adhesive 2013 for bonding the piezoelectric element 2012 to the elastic ring 2011 (such as an epoxy-based adhesive or a cyanoacrylate-based adhesive).

The application of two alternating voltages different from each other in phase by an odd multiple of $\pi/2$ to the piezoelectric element 2012 results in the generation of a flexural traveling wave in the vibration body 201, and hence each point on the sliding surface of the vibration body 201 undergoes an elliptical motion. The moving body 202 receives a frictional force from the vibration body 201 to rotate in the direction opposite to the flexural traveling wave. A body to be driven (not shown) is joined to the output shaft 203, and is driven by the rotary force of the moving body 202.

Figure 10B:
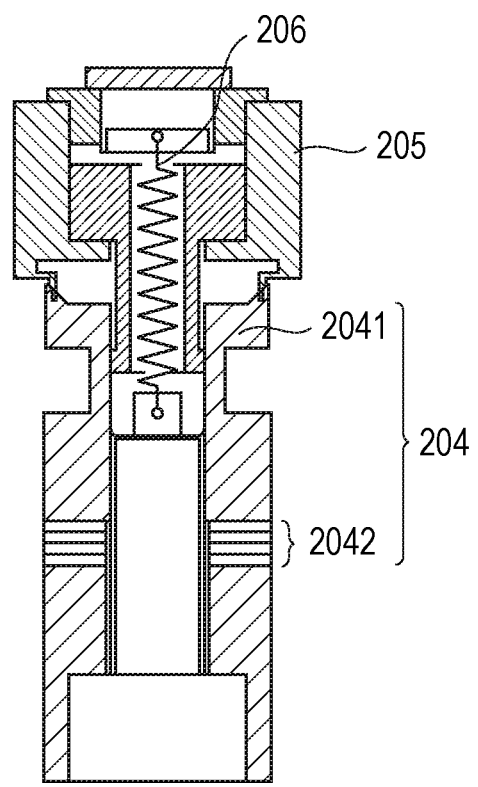

Next, a vibration wave motor including a piezoelectric element having a multilayered structure (multilayered piezoelectric element) is illustrated in FIG. 10B. A vibration body 204 is formed of a multilayered piezoelectric element 2042 sandwiched between tubular metal elastic bodies 2041. The multilayered piezoelectric element 2042 may be the multilayered piezoelectric element illustrated in FIG. 7B, and includes a first electrode and a second electrode on its outer surfaces of the stack, and internal electrodes on its inner surfaces of the stack. The metal elastic bodies 2041 sandwich and fix the multilayered piezoelectric element 2042 with bolts to form the vibration body 204.

The application of alternating voltages different from each other in phase to the multilayered piezoelectric element 2042 causes the vibration body 204 to excite two vibrations orthogonal to each other. The two vibrations are combined to form a circular vibration for driving the tip portion of the vibration body 204. A constricted annular groove is formed in the upper portion of the vibration body 204 to enlarge the displacement of the vibration for driving.

A moving body 205 (also referred to as rotor) is brought into contact with the vibration body 204 under pressure by a spring 206 for pressurization to obtain a frictional force for driving. The moving body 205 is rotatably supported by a bearing.

Next, an optical device using the vibration wave motor is described.

Figure 10C:
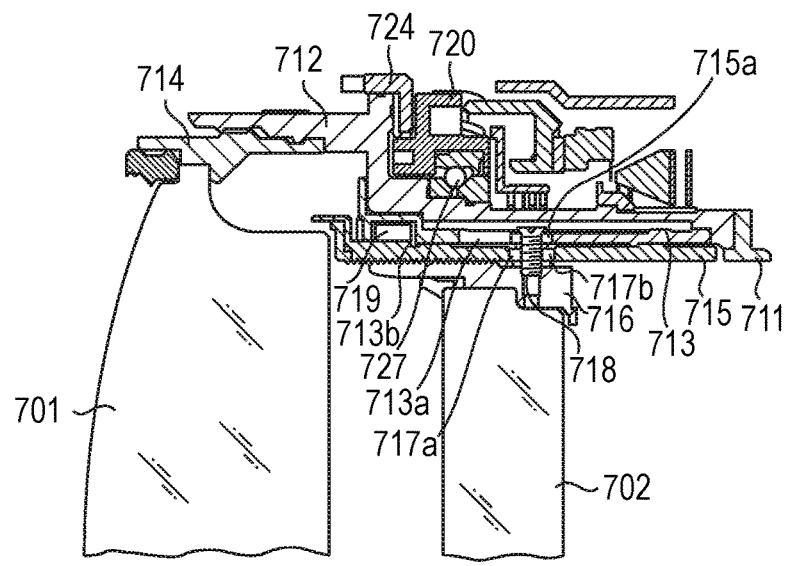
FIG. 10C, FIG. 10D, and FIG. 10E are schematic views for illustrating an optical device serving as an electronic device according to one embodiment of the present invention.
Figure 10D:
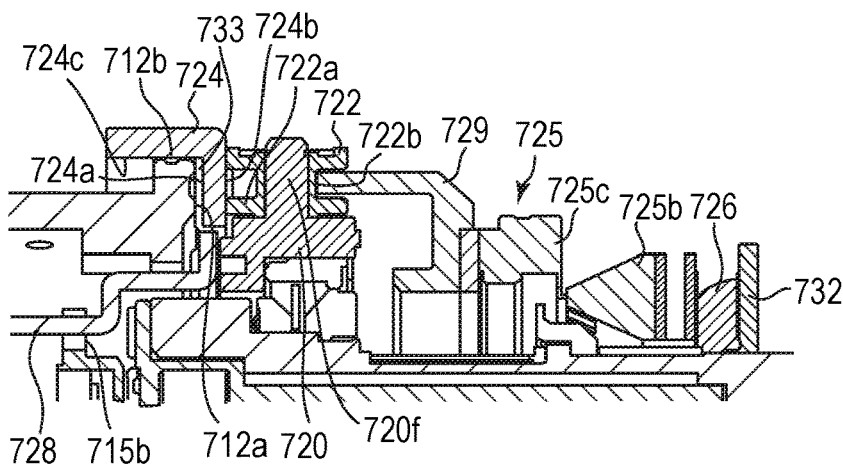
Figure 10E:
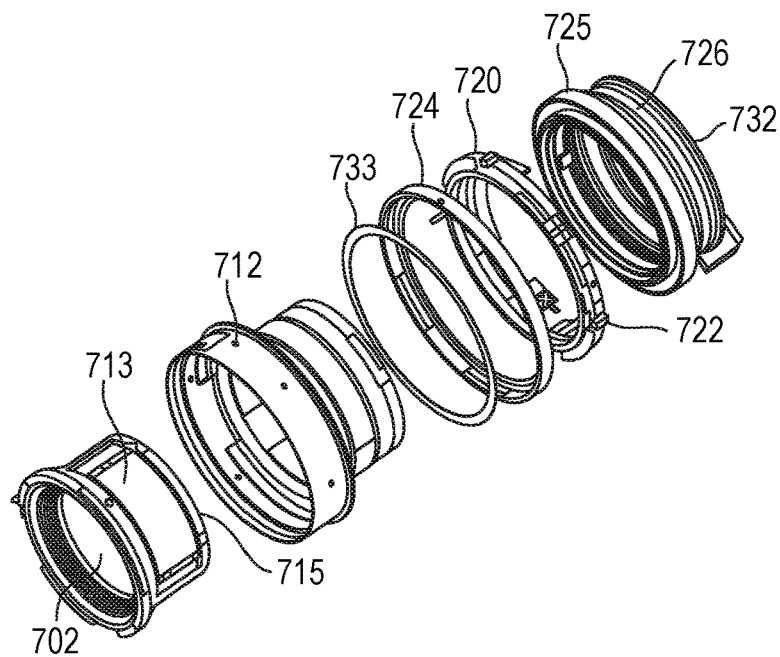

The optical device may also be said to be an example of the electronic device of the present invention. In FIG. 10C, FIG. 10D, and FIG. 10E, an optical device serving as an interchangeable lens barrel for a single-lens reflex camera is illustrated.

A fixed barrel 712, a linear guide barrel 713, and a front unit barrel 714 are fixed to an attaching/detaching mount 711 for a camera. Those members are fixed members of the interchangeable lens barrel.

A linear guide groove 713a in an optical axis direction for a focus lens 702 is formed on the linear guide barrel 713. Cam rollers 717a and 717b protruding outward in a radial direction are fixed to a rear unit barrel 716 holding the focus lens 702 via axial screws 718, and the cam roller 717a is fitted in the linear guide groove 713a.

A cam ring 715 is fitted on the inner periphery of the linear guide barrel 713 in a rotatable manner. Relative movement between the linear guide barrel 713 and the cam ring 715 in the optical axis direction is restricted because a roller 719 fixed to the cam ring 715 is fitted in an annular groove 713b of the linear guide barrel 713. A cam groove 715a for the focus lens 702 is formed on the cam ring 715, and the above-mentioned cam roller 717b is simultaneously fitted in the cam groove 715a.

On the outer peripheral side of the fixed barrel 712, there is arranged a rotation transmission ring 720 held by a ball race 727 in a rotatable manner at a constant position with respect to the fixed barrel 712. The rotation transmission ring 720 has shafts 720f extending radially from the rotation transmission ring 720, and rollers 722 are held by the shafts 720f in a rotatable manner. A large diameter part 722a of the roller 722 is brought into contact with a mount side end surface 724b of a manual focus ring 724. In addition, a small diameter part 722b of the roller 722 is brought into contact with a joining member 729. Six rollers 722 are arranged on the outer periphery of the rotation transmission ring 720 at regular intervals, and each roller is arranged in the relationship as described above.

A low friction sheet (washer member) 733 is arranged on an inner diameter part of the manual focus ring 724, and this low friction sheet is sandwiched between a mount side end surface 712a of the fixed barrel 712 and a front side end surface 724a of the manual focus ring 724. In addition, an outer diameter surface of the low friction sheet 733 is formed in a ring shape so as to be circumferentially fitted on an inner diameter part 724c of the manual focus ring 724. Further, the inner diameter part 724c of the manual focus ring 724 is circumferentially fitted on an outer diameter part 712b of the fixed barrel 712. The low friction sheet 733 has a role of reducing friction in a rotation ring mechanism in which the manual focus ring 724 rotates relatively to the fixed barrel 712 about the optical axis.

The large diameter part 722a of the roller 722 is brought into contact with the mount side end surface 724b of the manual focus ring under a state in which a pressure is applied by a pressing force of a waved washer 726 pressing a vibration wave motor 725 to the front of the lens. In addition, similarly, the small diameter part 722b of the roller 722 is brought into contact with the joining member 729 under a state in which an appropriate pressure is applied by a pressing force of the waved washer 726 pressing the vibration wave motor 725 to the front of the lens. Movement of the waved washer 726 in the mount direction is restricted by a washer 732 connected to the fixed barrel 712 by bayonet joint. A spring force (biasing force) generated by the waved washer 726 is transmitted to the vibration wave motor 725, and further to the roller 722, to be a force for the manual focus ring 724 to press the mount side end surface 712a of the fixed barrel 712. In other words, the manual focus ring 724 is integrated under a state in which the manual focus ring 724 is pressed to the mount side end surface 712a of the fixed barrel 712 via the low friction sheet 733.

Therefore, when a control unit (not shown) drives the vibration wave motor 725 to rotate with respect to the fixed barrel 712, the rollers 722 rotate about the shafts 720f because the joining member 729 is brought into frictional contact with the small diameter parts 722b of the rollers 722. As a result of the rotation of the rollers 722 about the shafts 720f, the rotation transmission ring 720 rotates about the optical axis.

Two focus keys 728 are mounted to the rotation transmission ring 720 at opposing positions, and the focus key 728 is fitted to a notch portion 715b arranged on the tip of the cam ring 715. Therefore, when the rotation transmission ring 720 rotates about the optical axis, the rotation force is transmitted to the cam ring 715 via the focus key 728. When the cam ring is rotated about the optical axis, the rear unit barrel 716 whose rotation is restricted by the cam roller 717a and the linear guide groove 713a is moved forward and backward along the cam groove 715a of the cam ring 715 by the cam roller 717b. Thus, the focus lens 702 is driven, and the focus operation is performed.

While the interchangeable lens barrel for the single-lens reflex camera has been described as the optical device using the vibration wave motor, the vibration wave motor can be applied to any optical device including the drive unit including the vibration wave motor, regardless of a type of the camera, including a compact camera, an electronic still camera, and the like.

The vibration device, the image pickup apparatus, the liquid ejection head, the liquid ejection apparatus, the vibration wave motor, and the optical device have been described above as examples of the electronic device of the present invention, but the kind of the electronic device is not limited thereto. The piezoelectric element of the present invention is applicable to all of the following: electronic devices each configured to detect an electric signal resulting from a positive piezoelectric effect or extract energy by extracting electric power from a piezoelectric element; and electronic devices each utilizing a displacement based on a converse piezoelectric effect obtained by inputting electric power into a piezoelectric element. For example, a piezoelectric acoustic component and a sound reproduction device, a sound recording device, a cellular phone, and an information terminal each including the piezoelectric acoustic component are also encompassed in the electronic device of the present invention.

EXAMPLES

The piezoelectric ceramics, piezoelectric element, vibration device, and electronic device of the present invention are hereinafter described more specifically by way of Examples. However, the present invention is not limited to the following Examples.

(Preparation of Ceramics Precursor)

A ceramics precursor containing Ba, Ca, Bi, Ti, Zr, Sn, and Hf and further containing Mn was prepared.

Raw material powders needed to form a composition of interest were selected from the following group of raw materials and used.

Commercially available powder of barium titanate (BaTiO$_3$), barium zirconate (BaZrO$_3$), or barium carbonate (BaCO$_3$, purity: 99.9% or more) was used as a Ba raw material. Commercially available powder of calcium titanate (CaTiO$_3$) was used as a Ca raw material. Commercially available powder of bismuth oxide (Bi$_2$O$_3$, purity: 99.9% or more, particle diameter: less than 500 nm) was used as a Bi raw material.

Commercially available powder of barium titanate (BaTiO$_3$), calcium titanate (CaTiO$_3$), or titanium oxide (TiO$_2$, purity: 99.9% or more) was used as a T1 raw material. Commercially available powder of barium zirconate (BaZrO$_3$) or calcium zirconate (CaZrO$_3$) was used as a Zr raw material.

Commercially available powder of barium stannate (BaSnO$_3$) or calcium stannate (CaSnO$_3$) was used as a Sn raw material.

Commercially available powder of hafnium titanate (HfTiO$_3$) was used as a Hf raw material.

First, in order to prepare a ceramics precursor of Production Example 1, the raw material powders were weighed so as to achieve a compositional ratio shown in Table 1, and were subjected to rotary mixing with a dry ball mill apparatus for 24 hours. Barium carbonate was used to adjust the "α" value. 3 mass % of a PVA binder was added to the mixed powder, and the mixture was subjected to granulation treatment with a spray dryer to provide the ceramics precursor of Production Example 1.

Ceramics precursors of Production Example 2 to Production Example 5, which were granulated powders of compositions shown in Table 1, were produced in the same manner as in Production Example 1.

Next, in order to find out the properties of each ceramics precursor alone, the granulated powder was filled into a mold and compressed to produce a disc-like compact. The resultant compact was put into an electric furnace having an air atmosphere, and was fired at a maximum temperature of 1,340° C. for 12 hours to provide a piezoelectric ceramics corresponding to each Production Example.

Next, the piezoelectric ceramics of each Production Example was polished so as to have a thickness of about 0.5 mm. In order to remove the internal stress of the piezoelectric ceramics resulting from the polishing treatment and organic components on the surface of the piezoelectric ceramics, the piezoelectric ceramics was subjected to heat treatment in an air atmosphere at 400° C. for 30 minutes.

Gold (Au) electrodes each having a thickness of 400 nm were formed on both front and rear surfaces of the piezoelectric ceramics after the heat treatment by a DC sputtering method. Titanium (Ti) was formed into a film having a thickness of 30 nm as a contact layer between the electrodes and the piezoelectric ceramics.

The piezoelectric ceramics with the electrodes was cut into a rectangular plate shape of 10 mm×2.5 mm×0.5 mmt suitable for the evaluation of properties. Thus, a piezoelectric element was produced.

For the purpose of aligning the spontaneous polarization axes of the piezoelectric element in a certain direction, the piezoelectric element was subjected to polarization treatment. Specifically, in a silicone oil bath kept at 150° C., a voltage of 1.2 kV/mm was applied to the sample for 30 minutes. While the voltage was applied, the sample was cooled to room temperature.

For the piezoelectric element that had been subjected to the polarization treatment, a resonance-antiresonance method was performed using an environmental test box and an impedance analyzer while the temperature was changed from −30° C. to +45° C. For example, in the case of the piezoelectric element using Production Example 1, measurement results as shown in FIG. 3C were obtained. In the case of Production Example 2, measurement results as shown in FIG. 3A were obtained. In the case of Production Example 3, measurement results as shown in FIG. 3B were obtained. Based on the chart of such measurement results, an orthorhombic-to-tetragonal phase transition temperature T$_{ot}$ and a piezoelectric constant |d$_{31}$| at the phase transition temperature were calculated. The results are shown in Table 1.

Example 1

A piezoelectric ceramics of Example 1 was manufactured using the granulated powder of Production Example 3 as a first ceramics precursor, and using the granulated powder of Production Example 1 as a second ceramics precursor.

In this combination, |T$_{otA}$−T$_{otB}$| was 30° C., 2|d$_{31A}$−d$_{31B}$|/|d$_{31A}$+d$_{31B}$| was 0.05, and (T$_{otA}$+T$_{otB}$)/2 was 20° C.

The powder of the first ceramics precursor (Production Example 3) was placed on the inner bottom surface of a cylindrical mold, and the same weight of the powder of the second ceramics precursor (Production Example 1) was placed and filled thereon. The granulated powders were subjected to uniaxial compressing to provide a disc-like multilayered body (compact). The filling amounts of the powders were adjusted so that a thickness after firing was 0.8 mm.

The resultant compact was put into an electric furnace having an air atmosphere, and was fired at a maximum temperature of 1,340° C. for 4 hours to provide a single-piece piezoelectric ceramics of Example 1 of the present invention. The piezoelectric ceramics had a disc shape, and had a thickness of 0.8 mm.

Part (1 g or more) of the piezoelectric ceramics was powdered and subjected to X-ray diffraction measurement, and its crystal structure was identified by Rietveld analysis. As a result, it was found that the sample was mostly formed of a single perovskite-type structure of an ABO$_3$ type.

The plate-like (disc-like) piezoelectric ceramics was analyzed for the composition in the depth direction thereof by alternately repeating X-ray fluorescence analysis and polishing from one surface side thereof. As a result, in each case of measurement, Ba, Ca, Ti, Zr, Mn, and O were detected. The content of Mn was 0.6 part by mol with respect to 100 parts by mol of the total number of moles of T1 and Zr, and there was no concentration change depending on sites in the ceramics. The content of a metal element other than Ba, Ca, Ti, Zr, and Mn was 0.1 mol % or less with respect to the total amount of all metal elements. The piezoelectric ceramics contained less than 100 ppm of Pb, and less than 200 ppm of K.

The concentrations of Ba, Ca, Ti, and Zr changed in the thickness direction of the plate-like piezoelectric ceramics. In particular, for Ca (Mi) and Zr (M$_2$), change tendencies of the concentrations as shown in FIG. 4A were observed.

That is, in Example 1, the concentrations of M$_1$ and M$_2$ changed in at least one direction of the piezoelectric ceramics, and the increase and decrease directions of the concentration changes of M$_1$ and M$_2$ were directions opposite to each other. In addition, the piezoelectric ceramics of Example 1 contained a plurality of regions different from each other in average composition in the form of layers. The plurality of regions included three regions, including a first region in which the concentration change of each of $M_1$ and $M_2$ in a perpendicular direction of the layers was 5% or less, a second region in which the concentration change was 5% or more, and a third region in which the concentration change was 5% or less.

Figure 11:
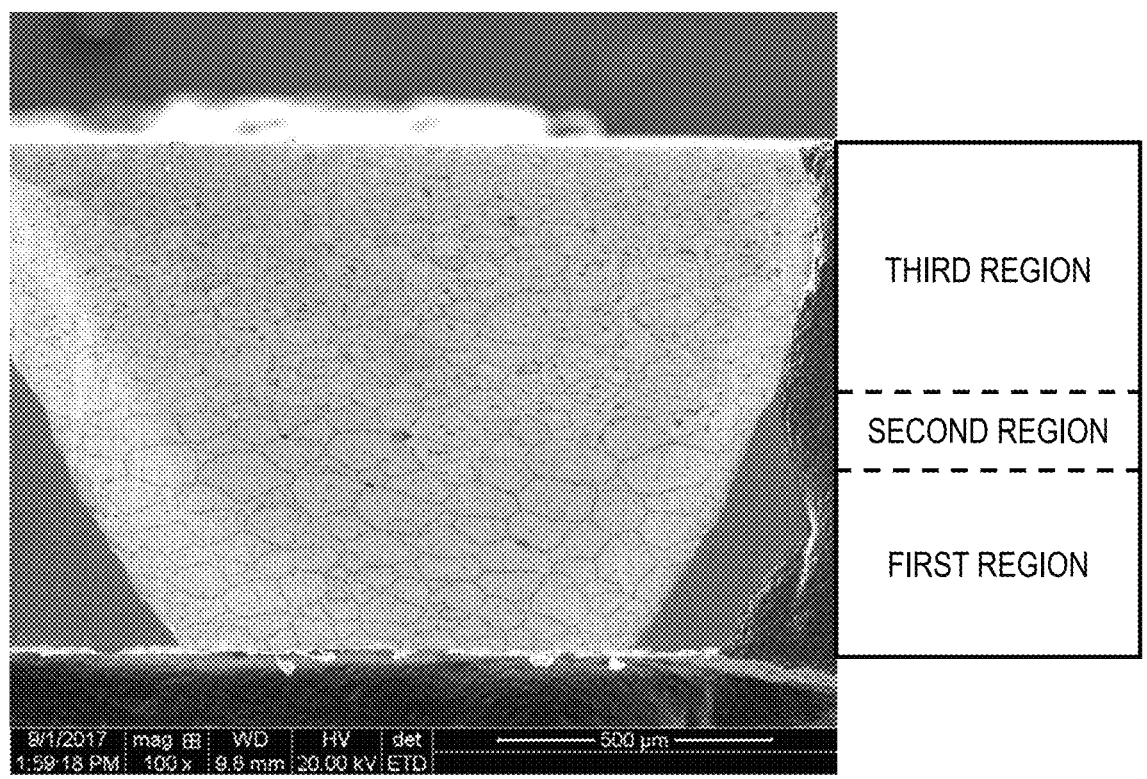
FIG. 11 is a drawing-substituting photograph and schematic diagram for showing a cross-sectional image in magnified observation of a piezoelectric ceramics of Example 1 of the present invention.

A photograph obtained by magnified observation of a cross-section of the piezoelectric ceramics of Example 1 with a scanning electron microscope is shown in FIG. 11. In order to facilitate the observation, the cross-section was taken obliquely to the perpendicular surface of the disc-like ceramics. Accordingly, the length of the cross-section is longer than the actual thickness of the disc. The lower portion of FIG. 11 corresponds to the first region, the central portion corresponds to the second region, and the upper portion corresponds to the third region. The grain diameter of the piezoelectric ceramics was evaluated based on the observation photograph. As a result, it was found that an average grain diameter in the first region was about 80 μm, and an average grain diameter in the third region was about 10 μm. That is, it was found that, in the piezoelectric ceramics, the crystal grain diameter was larger on the side of the surface on which the $M_1$ element was abundant and the $M_2$ element was scarce.

Next, a piezoelectric element of the present invention using the piezoelectric ceramics of Example 1 was produced.

First, the baked disc-like piezoelectric ceramics was polished so as to have a thickness of about 0.5 mm. The treatment was performed so that the losses of thickness due to the polishing on both surfaces of the disc were equal to each other. In order to remove the internal stress of the piezoelectric ceramics resulting from the polishing treatment and organic components on the surface of the piezoelectric ceramics, the piezoelectric ceramics was subjected to heat treatment in an air atmosphere at 400° C. for 30 minutes.

Gold (Au) electrodes each having a thickness of 400 nm were formed on both front and rear surfaces of the piezoelectric ceramics after the heat treatment by a DC sputtering method. Titanium (Ti) was formed into a film having a thickness of 30 nm as a contact layer between the electrodes and the piezoelectric ceramics.

The piezoelectric ceramics with the electrodes was cut into a rectangular plate shape of 10 mm×2.5 mm×0.5 mm suitable for the evaluation of properties. Thus, the piezoelectric element of the present invention was obtained. The mechanical strength of the piezoelectric material of Example 1 was high enough to allow the polishing and the cutting to be performed without any problem.

For the purpose of aligning the spontaneous polarization axes of the piezoelectric element in a certain direction, the piezoelectric element was subjected to polarization treatment. Specifically, in a silicone oil bath kept at 150° C., a voltage of 1.2 kV/mm was applied to the sample for 30 minutes. While the voltage was applied, the sample was cooled to room temperature.

For the piezoelectric element that had been subjected to the polarization treatment, a resonance-antiresonance method was performed using an environmental test box and an impedance analyzer while the temperature was changed from −30° C. to +45° C. As a result, measurement results as shown in FIG. 5A were obtained. Based on the chart thereof, an orthorhombic-to-tetragonal phase transition temperature Tmax and the absolute value dmax of a piezoelectric constant $d_{31}$ at the phase transition temperature were calculated. In addition, the minimum value of $|d_{31}|$ in the range of Tmax±10° C. was compared to dmax to calculate a change ratio therebetween. The results are shown in Table 2.

As shown in Table 2, dmax was 143 pm/V, Tmax was 35° C., and the change ratio of the piezoelectric constant in the range of Tmax±10° C. was a decrease of 8.3%.

Examples 2 to 6

Next, piezoelectric ceramics of the present invention were manufactured in the same manner as in Example 1 except that the combination of the ceramics precursors was changed.

The combination of the ceramics precursors in each Example, and $|T_{otA}-T_{otB}|$, $2|d_{31A}-d_{31B}|/|d_{31A}+d_{31B}|$, and $(T_{otA}+T_{otB})/2$ in the combination are as shown in Table 2.

Example 4 differs from other Examples in that three kinds of ceramics precursors are used. In this case, the first ceramics precursor, the second ceramics precursor, and the third ceramics precursor were placed and filled in the stated order on the inner bottom surface of the cylindrical mold. Placed weights were set so that the precursors had equal weights.

In each of Examples, the single-piece piezoelectric ceramics of the present invention was obtained, and was found by X-ray diffraction measurement to have a perovskite-type structure of an $ABO_3$ type as a primary phase.

The plate-like piezoelectric ceramics was analyzed for the composition in the depth direction thereof by alternately repeating X-ray fluorescence analysis and polishing from one surface side thereof. As a result, the following was found. For Examples 2, 3, and 4, Ba, Ca, Ti, Zr, Mn, and O were detected, and the content of any other metal element was 0.1 mol % or less with respect to the total amount of all metal elements. For Example 5, Ba, Ca, Bi, Zr, Sn, Mn, and O were detected, and the content of any other metal element was 0.1 mol % or less with respect to the total amount of all metal elements. For Example 6, Ba, Ca, Bi, Zr, Hf, Mn, and O were detected, and the content of any other metal element was 0.1 mol % or less with respect to the total amount of all metal elements. The content of Mn with respect to 100 parts by mol of the total number of moles of Ti, Zr, Sn, and Hf was as shown in Table 2, and there was no concentration change of Mn depending on sites in the ceramics. In each of Examples, the piezoelectric ceramics contained less than 100 ppm of Pb, and less than 200 ppm of K.

In all Examples, the concentrations of Ba, Ca, Bi, Ti, Zr, Sn, and Hf (except for undetected elements) changed in the thickness direction of the plate-like piezoelectric ceramics. For example, in the case of Example 2, change tendencies of the concentrations as shown in FIG. 4B were observed. In the case of Example 3, concentration changes as shown in FIG. 4C were observed, and in the case of Example 4, concentration changes as shown in FIG. 4D were observed.

That is, in all Examples, the concentrations of $M_1$ and $M_2$ changed in at least one direction of the piezoelectric ceramics, and the increase and decrease directions of the concentration changes of $M_1$ and $M_2$ were directions opposite to each other.

Next, the piezoelectric element of the present invention was produced in the same manner as in Example 1 using each of the piezoelectric ceramics of Examples 2 to 6.

For the piezoelectric element that had been subjected to polarization treatment, a resonance-antiresonance method was performed using an environmental test box and an impedance analyzer while the temperature was changed from −30° C. to +45° C. As a result, measurement results as shown in FIG. 5B, FIG. 5C, and FIG. 5D were obtained for Example 2, Example 3, and Example 4, respectively.

For all Examples, dmax, Tmax, and the change ratio of the piezoelectric constant in the range of Tmax±10° C. are shown in Table 2. The minus sign in the change ratio means a decrease in piezoelectric constant. The change ratio of the piezoelectric constant in the range of Tmax±10° C. was less than −15% in each of Examples, and particularly in each of Examples 1, 3, and 4, the change was as small as less than −10%.

Comparative Examples 1 to 3

Next, piezoelectric ceramics for comparison were manufactured in the same manner as in Examples 1 to 6.

As shown in Table 2, the granulated powder of the same Production Example was used for each of the first ceramics precursor and the second ceramics precursor.

In each of Comparative Examples, a single-piece ceramics was obtained, and was found by X-ray diffraction measurement to have a perovskite-type structure as a primary phase.

The composition in the depth direction was analyzed in the same manner as in Examples. As a result, for all the samples of Comparative Examples, Ba, Ca, Ti, Zr, Mn, and O were detected, and the content of any other metal element was 0.1 mol % or less with respect to the total amount of all metal elements. The content of Mn with respect to 100 parts by mol of the total number of moles of T1 and Zr was as shown in Table 2.

The concentration changes of Ca and Zr depending on sites in the ceramics were as shown in FIG. 2A, FIG. 2B, and FIG. 2C, and there was no substantial change. Similarly, none of Ba, Ti, and Mn had a concentration change depending on sites in the ceramics.

Next, the piezoelectric element for comparison was produced in the same manner as in Example 1 using each of the ceramics of Comparative Examples 1 to 3.

For the piezoelectric element that had been subjected to polarization treatment, a resonance-antiresonance method was performed using an environmental test box and an impedance analyzer while the temperature was changed from +45° C. to −30° C. As a result, measurement results as shown in FIG. 3A, FIG. 3B, and FIG. 3C were obtained for Comparative Example 1, Comparative Example 2, and Comparative Example 3, respectively.

For all Comparative Examples, dmax, Tmax, and the change ratio of the piezoelectric constant in the range of Tmax±10° C. are shown in Table 2. The change ratio of the piezoelectric constant in the range of Tmax±10° C. was −24% or more in each of Comparative Examples, and was significantly larger than that of each of Examples.

TABLE 1

| | Ba $1-x-y$ | Ca $x$ | Bi $y$ | Ti $1-l-m-n$ | Zr $l$ | Sn $m$ | Hf $n$ | $l + 2.5m + n$ | A site/ B site $\alpha$ | Mn [part(s) by mol] | $T_{ot}$ [° C.] | $|d_{31}|$ at $T_{ot}$ [pm/V] |
|---|---|---|---|---|---|---|---|---|---|---|---|---|
| Production Example 1 | 0.94 | 0.06 | 0 | 0.93 | 0.07 | 0 | 0 | 0.07 | 1.005 | 0.6 | 35 | 169 |
| Production Example 2 | 0.92 | 0.08 | 0 | 0.95 | 0.05 | 0 | 0 | 0.05 | 1.005 | 0.6 | 20 | 168 |
| Production Example 3 | 0.90 | 0.10 | 0 | 0.96 | 0.04 | 0 | 0 | 0.04 | 1.005 | 0.6 | 5 | 160 |
| Production Example 4 | 0.95 | 0.05 | 0.005 | 0.96 | 0.01 | 0 | 0.03 | 0.04 | 1.001 | 0.3 | 15 | 162 |
| Production Example 5 | 0.88 | 0.12 | 0.001 | 0.97 | 0.005 | 0.03 | 0 | 0.08 | 1.010 | 1.5 | 10 | 155 |

TABLE 2

| | First ceramics precursor | Second ceramics precursor | Third ceramics precursor | Mn [Part by mol] | $|T_{otA} - T_{otB}|$ [° C.] | $2|d_{31A} + d_{31B}|/|d_{31A} + d_{31B}|$ | $(T_{otA} + T_{otB})/2$ | dmax [pm/V] | Tmax [° C.] | $d_{31}$ change ratio in range of Tmax ± 10° C. |
|---|---|---|---|---|---|---|---|---|---|---|
| Example 1 | Production Example 3 | Production Example 1 | — | 0.6 | 30 | 0.05 | 20.0 | 143 | 35 | −8.3 |
| Example 2 | Production Example 3 | Production Example 2 | — | 0.6 | 15 | 0.05 | 12.5 | 148 | 20 | −13.0 |
| Example 3 | Production Example 2 | Production Example 1 | — | 0.6 | 15 | 0.01 | 27.5 | 150 | 35 | −7.6 |
| Example 4 | Production Example 2 | Production Example 1 | Production Example 3 | 0.6 | 15 | 0.01 | 27.5 | 144 | 35 | −7.4 |
| Example 5 | Production Example 5 | Production Example 2 | — | 1.0 | 10 | 0.08 | 15.0 | 149 | 20 | −14.2 |
| Example 6 | Production Example 4 | Production Example 2 | — | 0.5 | 5 | 0.04 | 17.5 | 161 | 20 | −14.9 |
| Comparative Example 1 | Production Example 2 | Production Example 2 | — | 0.6 | 0 | 0 | 20.0 | 168 | 20 | −38.2 |
| Comparative Example 2 | Production Example 3 | Production Example 3 | — | 0.6 | 0 | 0 | 5.0 | 160 | 5 | −29.3 |
| Comparative Example 3 | Production Example 1 | Production Example 1 | — | 0.6 | 0 | 0 | 35.0 | 169 | 35 | −24.7 |

Examples 7 to 12

The multilayered piezoelectric element of the present invention was produced in the following manner.

The mixed powders before spray drying granulation in Production Examples 1 to 5 were slurried with the addition of a PVB binder to provide ceramics precursors. Next, each of the ceramic precursors was formed into a sheet by a doctor blade method to provide a green sheet having a thickness of 50 μm.

In the same manner as in Examples 1 to 6, the first ceramics precursor and the second ceramics precursor, and as required, the third ceramics precursor were selected, and and a voltage of 1.5 kV/mm was applied between the first electrode and the second electrode for 30 minutes. While the voltage was applied, the sample was cooled to room temperature.

The resultant multilayered piezoelectric elements were evaluated for their piezoelectric constants with respect to the ambient temperature in the same manner as in Examples 1 to 6. The results are shown in Table 3. Also in each of the piezoelectric elements of Examples 7 to 12, the extent of fluctuation in piezoelectric constant in the range of Tmax±10° C. was less than −15%, comparable to that in each of the piezoelectric elements of Examples 1 to 6.

TABLE 3

| | First ceramics precursor | Second ceramics precursor | Third ceramics precursor | Mn [Part by mol] | $|T_{otA} - T_{otB}|$ [° C.] | $2|d_{31A} + d_{31B}|/|d_{31A} + d_{31B}|$ | $(T_{otA} + T_{otB})/2$ | dmax [pm/V] | Tmax [° C.] | $d_{31}$ change ratio in range of Tmax ± 10° C. |
|---|---|---|---|---|---|---|---|---|---|---|
| Example 7 | Production Example 3 | Production Example 1 | — | 0.6 | 30 | 0.05 | 20.0 | 140 | 35 | −7.8 |
| Example 8 | Production Example 3 | Production Example 2 | — | 0.6 | 15 | 0.05 | 12.5 | 144 | 20 | −10.1 |
| Example 9 | Production Example 2 | Production Example 1 | — | 0.6 | 15 | 0.01 | 27.5 | 146 | 35 | −6.9 |
| Example 10 | Production Example 2 | Production Example 1 | Production Example 3 | 0.6 | 15 | 0.01 | 27.5 | 142 | 35 | −6.8 |
| Example 11 | Production Example 5 | Production Example 2 | — | 1.0 | 10 | 0.08 | 15.0 | 145 | 20 | −12.2 |
| Example 12 | Production Example 4 | Production Example 2 | — | 0.5 | 5 | 0.04 | 17.5 | 156 | 20 | −13.5 | two or three green sheets were subjected to compression bonding to provide a green sheet having a composition distribution. The multilayered piezoelectric element of the present invention is obtained by alternately stacking the green sheet having a composition distribution and an internal electrode.

Correspondences between Examples and the kinds of ceramics precursors are shown in Table 3.

A conductive paste for an internal electrode was printed on the surface of the green sheet having a composition distribution. As the conductive paste, an Ag70%-Pd30% alloy (Ag/Pd=2.33) paste was used. Nine of the green sheets coated with the conductive paste were stacked, and the multilayered body was fired at 1,200° C. for 5 hours to obtain a sintered body. The thickness after the sintering was 0.6 mm in each of Examples 7 to 9, 11, and 12. The thickness of the sintered body in Example 10 was 0.9 mm. The sintered body was cut to a size of 10 mm×2.5 mm, and then side surfaces thereof were polished. A pair of external electrodes (first electrode and second electrode) for short-circuiting the internal electrodes alternately was formed by Au sputtering to produce the multilayered piezoelectric element as illustrated in FIG. 7B.

A cross-section of each of the multilayered piezoelectric elements of Example 7 to Example 12 was observed. As a result, it was found that the internal electrodes formed of Ag-Pd and the piezoelectric ceramics layers were alternately formed, and the $M_1$ element and the $M_2$ element increased and decreased in directions opposite to each other in the layer thickness direction in each of the piezoelectric ceramics layers.

The multilayered piezoelectric elements of Example 7 to Example 12 were each subjected to polarization treatment. Specifically, the sample was heated to 150° C. in an oil bath, Example 13

Through the use of each of the piezoelectric elements of Examples 1 to 12, the dust removing device illustrated in FIG. 8A and FIG. 8B was produced. Spherical beads made of plastic were scattered, and an alternating voltage having a constant amplitude was applied. As a result, it was confirmed that satisfactory dust removal behavior was stably exhibited in the ambient temperature range of from 0° C. to 40° C.

Through the use of the dust removing device, the image pickup apparatus illustrated in FIG. 8C and FIG. 8D was produced. The image pickup apparatus was energized and operated in the ambient temperature range of from 0° C. to 40° C. As a result, dust on the surface of the image pickup unit was satisfactorily removed, and an image without a dust defect was obtained.

Example 14

Through the use of each of the piezoelectric elements of Examples 1 to 12, the liquid ejection head illustrated in FIG. 9A was produced. An alternating voltage having a constant amplitude was applied, and as a result, it was confirmed that ink was stably discharged in accordance with a signal in the ambient temperature range of from 0° C. to 40° C.

Through the use of the liquid ejection head, the liquid ejection apparatus illustrated in FIG. 9B was produced. The liquid ejection apparatus was energized and operated in the ambient temperature range of from 0° C. to 40° C. As a result, it was confirmed that ink was discharged onto a recording medium in accordance with an input electric signal.

Example 15

Through the use of each of the piezoelectric elements of Examples 1 to 12, the ultrasonic motor illustrated in FIG.

10A or FIG. 10B was produced. An alternating voltage having a constant amplitude was applied, and as a result, it was confirmed that the motor stably rotated in the ambient temperature range of from 0° C. to 40° C.

Through the use of the ultrasonic motor, the optical device illustrated in FIG. 10C, FIG. 10D, and FIG. 10E was produced. The optical device was energized and operated in the ambient temperature range of from 0° C. to 40° C. As a result, it was confirmed that automatic focus operation was performed in accordance with an applied alternating voltage.

The piezoelectric material of the present invention has a gradual change in piezoelectric constant depending on an ambient temperature. In addition, the piezoelectric material of the present invention is free of lead, and hence has a small load on the environment. Accordingly, the piezoelectric ceramics of the present invention can be utilized for an electronic device required to be stably operated at various ambient temperatures, such as a dust removing device, a liquid ejection head, or a vibration wave motor.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-020321, filed Feb. 7, 2018, which is hereby incorporated by reference herein in its entirety.

What is claimed is:

1. A single-piece piezoelectric ceramic comprising as a main component a perovskite-type metal oxide represented by a compositional formula of $ABO_3$, wherein an A site element in the compositional formula contains Ba and $M_1$, the $M_1$ being formed of at least one of Ca and Bi, where a ratio x of a molar amount of Ca to a total molar amount of Ba, Ca, and Bi is $0 \leq x \leq 0.12$, and a ratio y of a molar amount of Bi to the total molar amount of Ba, Ca, and Bi is $0 \leq y \leq 0.005$, wherein a B site element in the compositional formula contains $T_1$ and $M_2$, the $M_2$ being formed of at least one of Zr, Sn, and Hf, where a ratio l of a molar amount of Zr to a total molar amount of Ti, Zr, Sn, and Hf, a ratio m of a molar amount of Sn to the total molar amount of Ti, Zr, Sn, and Hf, and a ratio n of a molar amount of Hf to the total molar amount of Ti, Zr, Sn, and Hf are, respectively, $0 \leq l \leq 0.08$, $0 \leq m \leq 0.03$, and $0 \leq n \leq 0.08$, wherein concentrations of the $M_1$ and the $M_2$ change in at least one direction of the piezoelectric ceramic, and wherein increase and decrease directions of concentration changes of the $M_1$ and the $M_2$ are directions opposite to each other.

2. The piezoelectric ceramic according to claim 1, wherein the piezoelectric ceramic contains a plurality of regions different from each other in average composition in a form of layers.

3. The piezoelectric ceramic according to claim 2, wherein the plurality of regions include at least three regions including:

a first region in which a concentration change of at least one of the $M_1$ or the $M_2$ in a perpendicular direction of the layers is 5% or less;

a second region in which the concentration change is 5% or more; and a third region in which the concentration change is 5% or less.

4. The piezoelectric ceramic according to claim 1, further comprising a Mn component in an amount of 0.3 part by mol to 1.5 parts by mol on a metal basis with respect to 100 parts by mol of the perovskite-type metal oxide.

5. A piezoelectric element comprising:

a first electrode;

a piezoelectric ceramic portion; and a second electrode, wherein a piezoelectric ceramic for forming the piezoelectric ceramic portion comprises the piezoelectric ceramic of claim 1.

6. The piezoelectric element according to claim 5, wherein the piezoelectric ceramic portion includes at least one internal electrode, and the piezoelectric element has a multilayered structure in which piezoelectric ceramic layers each formed of the piezoelectric ceramic and the at least one internal electrode in a form of a layer are alternately stacked.

7. A vibration device comprising a vibration body including a diaphragm including the piezoelectric element of claim 5.

8. An electronic device comprising the piezoelectric element of claim 5.

9. The piezoelectric ceramic according to claim 1, wherein the piezoelectric ceramic contains less than 1,000 ppm of a Pb component and a K component in total.

10. The piezoelectric ceramic according to claim 1, wherein the compositional formula of $ABO_3$ is expressed as $(Ba_{1-x-y}Ca_xBi_y)\alpha(Ti_{1-t-m-n}Zr_lSn_mHf_n)O_3$, where $0.98 \leq \alpha \leq 1.02$.

* * * * *